US008446976B2

(12) United States Patent
Lee et al.

(10) Patent No.: US 8,446,976 B2
(45) Date of Patent: *May 21, 2013

(54) SIGNAL GENERATOR WITH ADJUSTABLE PHASE

(75) Inventors: Chong U. Lee, San Diego, CA (US); David Jonathan Julian, San Diego, CA (US); Amal Ekbal, San Diego, CA (US); Pavel Monat, San Diego, CA (US); Wei Xiong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 713 days.

This patent is subject to a terminal disclaimer.

(21) Appl. No.: 11/859,335

(22) Filed: Sep. 21, 2007

(65) Prior Publication Data
US 2009/0080568 A1    Mar. 26, 2009

(51) Int. Cl.
*H03K 7/06* (2006.01)
(52) U.S. Cl.
USPC ........... 375/271; 375/211; 375/223; 375/302; 375/322; 329/315; 332/117; 370/215; 398/187
(58) Field of Classification Search
USPC .......... 375/271, 211, 223, 302, 322; 329/315; 332/117; 370/215; 398/187
See application file for complete search history.

(56) References Cited

U.S. PATENT DOCUMENTS

| | | | |
|---|---|---|---|
| 4,152,675 A | 5/1979 | Jett, Jr. | |
| 5,053,723 A | 10/1991 | Schemmel | |
| 5,459,530 A * | 10/1995 | Andersson et al. | ........... 348/645 |
| 5,471,187 A | 11/1995 | Hansen et al. | |
| 5,545,941 A * | 8/1996 | Soneda et al. | ................ 310/318 |
| 5,654,987 A | 8/1997 | Nakamura | |
| 5,687,169 A | 11/1997 | Fullerton | |
| 5,764,696 A | 6/1998 | Barnes et al. | |
| 5,764,698 A | 6/1998 | Sudharsanan et al. | |
| 5,777,522 A | 7/1998 | Rybicki et al. | |
| 5,812,081 A | 9/1998 | Fullerton | |
| 5,832,035 A | 11/1998 | Fullerton | |
| 5,852,630 A | 12/1998 | Langberg et al. | |
| 5,907,427 A | 5/1999 | Scalora et al. | |

(Continued)

FOREIGN PATENT DOCUMENTS

| CN | 1848682 A | 10/2006 |
|---|---|---|
| EP | 0404230 A2 | 12/1990 |

(Continued)

OTHER PUBLICATIONS

Weigandt, "Analysis of timing jitter in CMOS ring oscillators" 1994 IEEE International Symposium on Circuits and Systems, 1994, ISCAS '94. vol. 4, Publication Year: 1994 , pp. 27-30 vol. 4.*

(Continued)

*Primary Examiner* — Juan A Torres
(74) *Attorney, Agent, or Firm* — Paul S. Holdaway

(57) ABSTRACT

Phase of an output signal is based on comparison of an oscillating signal with an adjustable threshold. Here, adjustment of the threshold results in a corresponding adjustment of the phase of the output signal. For example, the adjustable threshold may comprise an adjustable bias signal for a transistor circuit whereby the oscillating signal is provided as an input to the transistor circuit and the output of the transistor circuit provides the output signal. In some aspects these phase adjustment techniques may be employed to provide one or more tunable multiphase clocks.

40 Claims, 17 Drawing Sheets

U.S. PATENT DOCUMENTS

| | | | |
|---|---|---|---|
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,337,603 B1 | 1/2002 | Kinugasa et al. | |
| 6,351,652 B1 | 2/2002 | Finn et al. | |
| 6,354,946 B1 | 3/2002 | Finn | |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,639,474 B2 | 10/2003 | Asikainen et al. | |
| 6,639,947 B1 | 10/2003 | Bredius | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Fullerton et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,810,087 B2 * | 10/2004 | Hoctor et al. | 375/259 |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,900,732 B2 | 5/2005 | Richards | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,949,981 B2 | 9/2005 | Natonio et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,980,613 B2 | 12/2005 | Krivokapic | |
| 6,989,751 B2 | 1/2006 | Richards | |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,706 B2 | 4/2006 | Yao | |
| 7,030,806 B2 | 4/2006 | Fullerton | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,079,827 B2 | 7/2006 | Richards et al. | |
| 7,081,789 B2 | 7/2006 | Klemmer | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,187,705 B1 * | 3/2007 | Richmond | 375/130 |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 7,446,614 B2 | 11/2008 | Kawamoto et al. | |
| 7,573,932 B2 * | 8/2009 | Kim et al. | 375/130 |
| 7,680,236 B1 * | 3/2010 | Melanson et al. | 375/376 |
| 7,702,292 B2 * | 4/2010 | Philippe | 455/76 |
| 7,965,805 B2 | 6/2011 | Lee et al. | |
| 2002/0101947 A1 * | 8/2002 | Sumiyoshi | 375/376 |
| 2003/0081538 A1 * | 5/2003 | Walton et al. | 370/206 |
| 2004/0012447 A1 | 1/2004 | Nagaishi et al. | |
| 2004/0109520 A1 * | 6/2004 | Hsu et al. | 375/376 |
| 2004/0155718 A1 * | 8/2004 | Kawashima | 331/158 |

| | | | | | | |
|---|---|---|---|---|---|---|
| 2005/0179501 A1* | 8/2005 | Natonio et al. ............... 331/16 | JP | 2001136061 A | 5/2001 | |
| 2006/0068744 A1 | 3/2006 | Maligeorgos et al. | JP | 2001186017 A | 7/2001 | |
| 2006/0226918 A1 | 10/2006 | Belitzer et al. | JP | 2001522185 A | 11/2001 | |
| 2006/0261873 A1* | 11/2006 | Kawamoto et al. ........... 327/184 | JP | 2002267725 A | 9/2002 | |
| 2007/0024379 A1* | 2/2007 | Greenberg et al. ............. 331/16 | JP | 2003091941 A | 3/2003 | |
| 2007/0177704 A1 | 8/2007 | McEwan | JP | 2004048189 A | 2/2004 | |
| 2007/0255971 A1* | 11/2007 | Brooks et al. ................ 713/375 | JP | 2004056172 A | 2/2004 | |
| 2008/0116941 A1 | 5/2008 | Ekbal et al. | JP | 2006303554 A | 11/2006 | |
| 2009/0072873 A1* | 3/2009 | Denier ........................... 327/175 | JP | 2007060649 A | 3/2007 | |
| 2009/0074407 A1* | 3/2009 | Hornbuckle et al. ........... 398/43 | JP | 2007081593 A | 3/2007 | |
| 2009/0080101 A1 | 3/2009 | Lee et al. | TW | 328991 | 4/1998 | |
| | | | TW | 200712509 A | 4/2007 | |
| | | | WO | WO2007016626 A2 | 2/2007 | |

FOREIGN PATENT DOCUMENTS

| | | |
|---|---|---|
| GB | 2007450 | 5/1979 |
| GB | 2268647 | 1/1994 |
| JP | 54045558 A | 4/1979 |
| JP | 57058214 A | 4/1982 |
| JP | 61251259 A | 11/1986 |
| JP | 3101433 A | 4/1991 |
| JP | 3235522 A | 10/1991 |
| JP | 5020407 U | 3/1993 |
| JP | 5227145 A | 9/1993 |
| JP | 9289439 A | 11/1997 |
| JP | 2000091912 A | 3/2000 |

OTHER PUBLICATIONS

International Search Report, PCT/US2007/079338—International Search Authority—European Patent Office, May 6, 2008.

Written Opinion, PCT/US2007/079338—International Search Authority—European Patent Office, May 6, 2008.

Taiwan Search Report—TW097102224—TIPO—Oct. 15, 2011.

* cited by examiner

SIGNAL GENERATOR WITH ADJUSTABLE PHASE

CROSS-REFERENCE TO RELATED APPLICATIONS

This application is related to concurrently filed and commonly owned U.S. patent application Ser. No. 11/859,723, entitled "SIGNAL GENERATOR WITH ADJUSTABLE FREQUENCY," and U.S. patent application Ser. No. 11/859,354, entitled "SIGNAL GENERATOR WITH SIGNAL TRACKING," the disclosure of each of which is hereby incorporated by reference.

BACKGROUND

1. Field

This application relates generally to data communication and more specifically, but not exclusively, to generating a signal such as a clock signal with adjustable phase and/or frequency, and to generating a signal that tracks another signal.

2. Background

In some applications, a communication system may generate signals where the frequency and the phase of the signals are adjustable to some degree. For example, a typical receiver may use a clock signal to recover data from a received signal. In this case, the frequency and phase of the clock signal may be synchronized to the frequency and phase of the received signal to improve the accuracy with which the data is recovered from the received signal. In addition, some systems may employ multiphase clocks where the different phases may be used at different times and/or for different circuits.

In practice, undesirable trade-offs relating to, for example, complexity, power consumption, and cost may need to be made to provide signals having the desired frequency and phase qualities. As an example, an ultra-wideband communication system may employ very narrow pulses and a high level of duty cycling to reduce the power requirements of associated transceiver components. Here, the effectiveness with which received data is recovered depends, in part, on appropriate tracking of the timing of the received pulses. Due to the use of relatively narrow pulse widths, however, a synchronization and tracking structure that provides a sufficient level of tracking performance may be undesirably complex. For example, in some implementations a synchronization and tracking circuit may comprise a phase lock loop or some form of a voltage controlled oscillator circuit to generate signals with appropriate frequency and/or phase (e.g., different clock phases in a multiphase system). In addition, in some implementations a synchronization and tracking circuit may comprise a high-frequency oscillator and a high-frequency phase locked loop ("PLL") or delay locked loop ("DLL"). In this case, the operating frequency of the PLL/DLL may be selected so that the PLL/DLL provides sufficient resolution for a tracking and acquisition control signal.

In practice, the above techniques may be relatively complicated and may consume a relatively large amount of power. Consequently, these techniques may be inappropriate for many applications.

SUMMARY

A summary of sample aspects of the disclosure follows. It should be understood that any reference to the term aspects herein may refer to one or more aspects of the disclosure.

The disclosure relates in some aspects to signal generation schemes for relatively low-complexity systems. Such systems may include, for example, receivers that may be employed in ultra-wideband applications.

The disclosure relates in some aspects to circuits that generate one or more signals where the frequency and/or the phase of each signal may be adjusted. For example, some implementations relate to a relatively lower-complexity tunable multiphase clock generator. Here, the clock generator may employ a low-frequency oscillator that has an operating frequency on the order of the pulse repetition frequency of the pulses processed by an associated device (e.g., a receiver). Similarly, some implementations relate to a relatively low-complexity synchronization and tracking circuit that employs an oscillator having an operating frequency on the order of the pulse repetition frequency of the pulses processed by the circuit.

Advantageously, a device that incorporates such circuits may be less complex, may consume less power, and may have lower implementation cost than devices that employ traditional clocking schemes such as a PLL or a DLL. Such circuits may be particularly advantageous in applications such as ultra-wideband where it may be highly desirable for a device to be relatively small in size, have very low power consumption, and have very low cost.

In some aspects a signal generator generates an adjustable phase output signal where the phase of the output signal is based on comparison of an oscillating signal with an adjustable threshold (e.g., an adjustable reference signal). In this case, adjustment of the threshold results in a corresponding adjustment of the phase of the output signal. For example, in some implementations the adjustable threshold comprises an adjustable bias signal for a transistor circuit where the oscillating signal is provided as an input to the transistor circuit and the output of the transistor circuit provides the output signal. The above techniques may be employed in one or more signal generator circuits to provide one or more tunable multiphase clocks.

In some aspects a signal generator generates an output signal where the frequency and/or the phase of the output signal is adjusted by temporarily adjusting the frequency of an oscillating signal. For example, in some implementations the frequency of the oscillating signal is adjusted for a short period of time to effect a slight change (e.g., skew) in the phase of the output signal. In addition, in some implementations the frequency of the oscillating signal is temporarily adjusted in a repeated manner to provide an output signal having an effective frequency that lies between two baseline frequency values. In some aspects the frequency of the oscillating signal is adjusted by selectively coupling one or more reactive circuits to an oscillator circuit and/or by changing the reactance of one or more reactive circuits.

In some aspects the frequency and phase of one or more output signals is adjusted to track one or more input signals. Here, at least one control signal is adjusted to control a frequency of an oscillating signal from which the output signal is derived. In addition, the phase of each output signal is adjusted based on comparison of the oscillating signal with an associated adjustable threshold.

BRIEF DESCRIPTION OF THE DRAWINGS

These and other features, aspects and advantages of the disclosure will be more fully understood when considered with respect to the following detailed description, appended claims and accompanying drawings, wherein:

Figure 1:
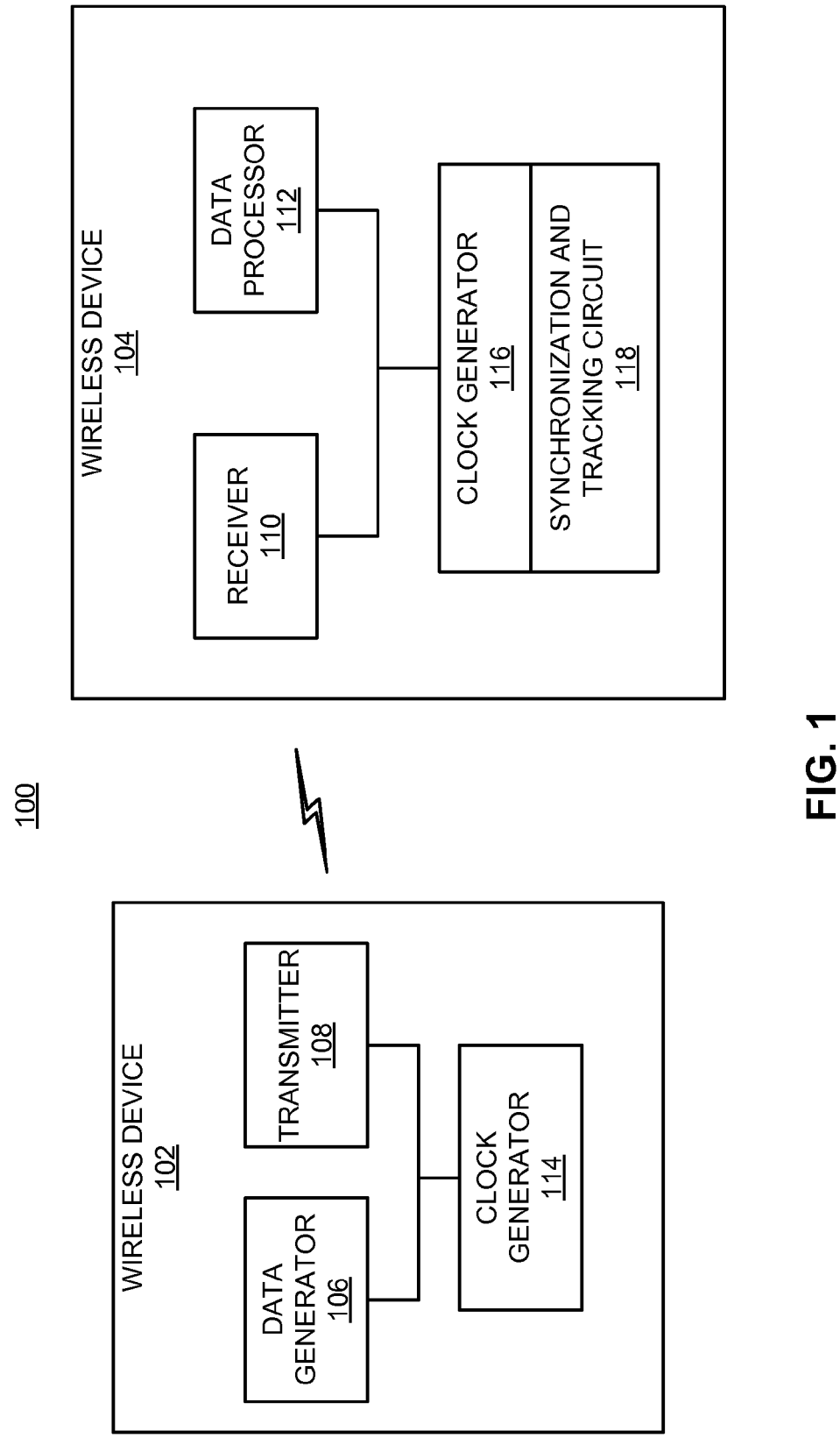
FIG. 1 is a simplified block diagram of several sample aspects of a wireless communication system.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of the above, in some aspects an apparatus may comprise a comparator configured to compare an oscillating signal with an adjustable threshold to provide an output signal having an adjustable phase. In addition, in some aspects such a comparator may be implemented in an apparatus for providing a signal that tracks another signal.

FIG. 1 illustrates several sample aspects of a communication system 100 where a wireless device 102 communicates with a wireless device 104. In particular, FIG. 1 illustrates several components 106 and 108 of a transmit path of the device 102 and several components 110 and 112 of a receive path of the device 104.

In conjunction with the transmission and reception of signals, the devices 102 and 104 may generate signals having adjustable frequency and/or phase. For example, the device 102 may employ a clock generator 114 that generates one or more adjustable phase clock signals. Such signals may be used, for example, to synchronize data flow through the transmit path of the device 102.

The receive path of the device 104 may employ a similar clock generator 116. Here, the clock generator 116 may generate one or more multiphase clock signals that may be used to synchronize a master receive clock with the received signals. For example, during two-way communication the transmitter master clock and the receiver master clock may not be time aligned. As will be discussed in more detail below, an adjustable frequency/phase clock generator 116 may therefore be employed in a synchronization and tracking circuit 118 to provide a receive clock signal that is synchronized in frequency and phase with received data signals.

Multiphase clocks signals provided by the clock generator 116 also may be used during a signal acquisition procedure. For example, an adjustable phase signal may be employed in conjunction with a search algorithm (e.g., during hypothesis testing) to find the correct phase offset for the receive clock signal. Here, it should be appreciated that the phase of the received signal may not be known. Thus, the device 104 may adjust the phase of the receive clock signal in relatively small steps whereby, at each phase value, the device attempts to lock onto the received signal. As will be discussed in more detail below, a clock generator as taught herein may provide an efficient mechanism for providing a series of phase offsets.

Also, in some implementations a wireless device (e.g., device 102 or 104) may be transmitting to or receiving from multiple wireless devices where the phase of the master clock of each wireless device may be different. Here, it may be desirable to readily switch the phase of a local clock to match the different clock phases associated with the multiple wireless devices. For example, the device 104 may select one local phase when receiving from one wireless device and select another local phase when receiving from another wireless device. As will be discussed in more detail below, a clock generator as taught herein may provide an efficient mechanism for providing multiple clock phases.

With the above in mind, several sample signal generator apparatuses and operations will now be treated in more detail. It should be appreciated that the specific components and operations described below are provided for illustration purposes, and that an apparatus constructed in accordance with the teachings herein may employ other components and may be used in conjunction with other types of operations.

Figure 2:
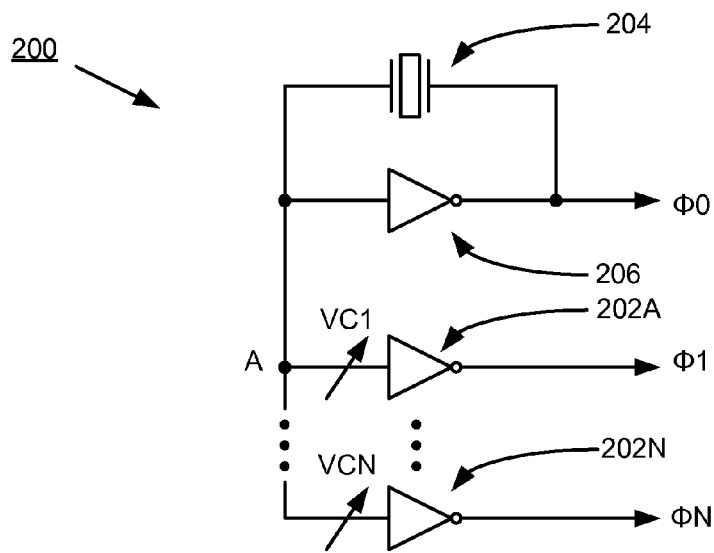
FIG. 2 is a simplified diagram of several sample aspects of a signal generator circuit configured to provide multiphase signals.

FIG. 2 illustrates sample aspects of a signal generator circuit 200 (e.g., a clock generator) that may be configured to generate at least one output signal having an adjustable phase. Specifically, the circuit 200 may provide an output signal on one or more branches as represented by the output signals ϕ1-ϕN. Here, each branch includes an adjustable phase circuit designated 202A-202N, respectively.

As illustrated in FIG. 2, in some implementations a signal generator may be implemented using a relatively simple oscillator circuit. For example, the oscillator circuit may comprise a crystal oscillator 204 that is coupled in parallel to a buffer, a high-quality amplifier, or some other suitable device 206. In some implementations the device 206 comprises an inverter. The oscillator circuit generates an output signal (e.g., a square wave clock signal) designated ϕ0 in FIG. 2.

In some implementations an oscillator circuit as taught herein (e.g., the circuit comprising the oscillator 204 and the inverter 206) may have a relatively high quality factor (commonly referred to as the"Q" of the circuit). In some aspects a high-Q signal may have substantially no harmonic components (e.g., the signal is substantially monotonic). Consequently, relatively accurate changes in phase (as discussed below) may be obtained through the use of a high-Q signal since such a signal may be substantially jitter-free. In some implementations the quality factor of an oscillator circuit may be on the order of 10 or more.

The phases of the output signals ϕ1-ϕN generated by the circuits 202A-202N are skewed by control signals VC1-VCN, respectively. Accordingly, the phase of a given one of the output signals ϕ1-ϕN may be set independently of the phase of any other output signal. In addition, the phases of the output signals ϕ1-ϕN may be different than the phase of the output signal ϕ0 of the oscillator circuit.

Figure 3:
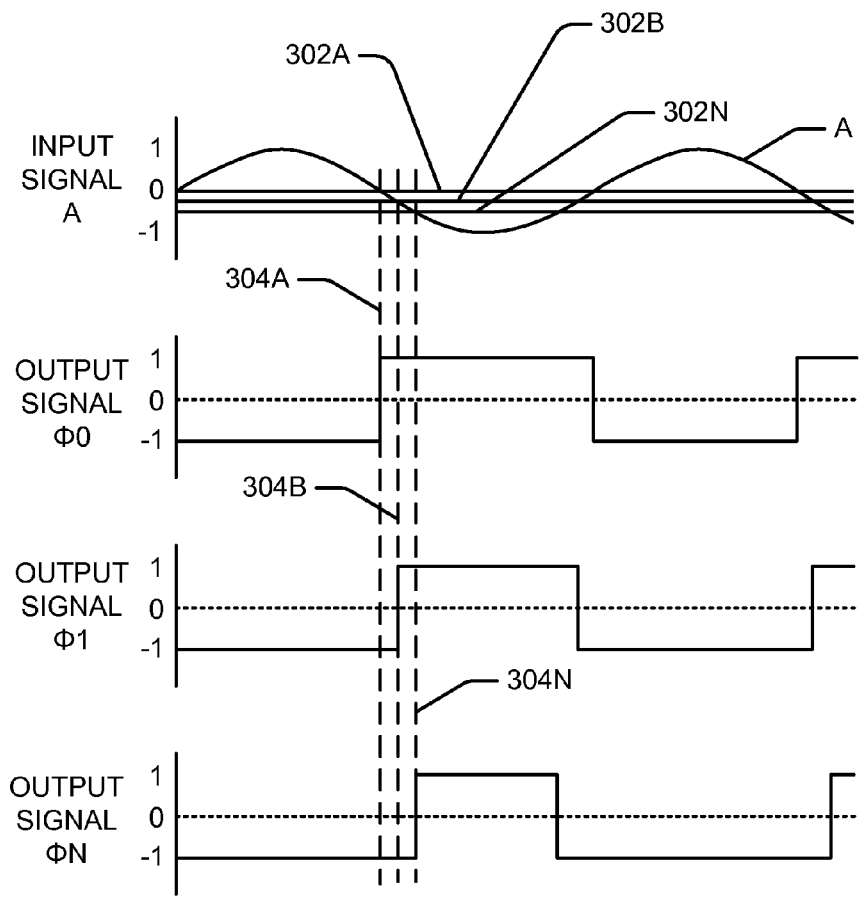
FIG. 3 is a simplified timing diagram illustrating an example of how multiphase signals may be provided.

FIG. 3 depicts several waveforms that illustrate, in a simplified manner, sample relationships between the control signals VC1-VCN and the output signals ϕ0-ϕN. The top waveform illustrates a sinusoidal-like signal A that is generated by the oscillator 204 and provided to the inputs of the circuits 202A-202N. The top waveform also depicts several sample decision levels as represented by horizontal lines 302A, 302B, and 302N.

The next waveform down illustrates, in a simplified form, the output signal ϕ0. This waveform also illustrates that the time at which the output signal ϕ0 transitions from low to high or vice versa (e.g., as represented by a vertical line 304A) is based on a decision level of the device 206. In this example, this decision level is represented by the horizontal line 302A. In other words, the device 206 generates a transition at the output signal ϕ0 whenever the input signal A crosses the decision level 302A.

The waveform for the output signal ϕ1 illustrates that this signal may be set to transition when the input signal A crosses a different decision level (e.g., decision level 302B). This decision point is represented by a vertical line 304B. In this case, the value of the control signal VC1 controls the decision level for the circuit 202A. A change in the decision level, in turn, causes the inverter of the circuit 202A to trigger sooner or later.

In a similar manner, the waveform for the output signal ϕN illustrates that this signal may be set to transition when the input signal A crosses yet another decision level (e.g., decision level 302N). This decision point is represented by a vertical line 304N. Here, the value of the control signal VCN controls the decision level for the circuit 202N.

An adjustable phase circuit (e.g., circuits 202A and 202N) may be implemented in a variety of ways. For example, an adjustable phase circuit may comprise a comparator that compares the level of an input signal (e.g., input signal A) with an adjustable threshold (e.g., an adjustable reference signal). Such a comparator may take a variety of forms including, for example, a buffer (e.g., an inverter) having an adjustable decision threshold, a transistor circuit having an adjustable bias, an operational amplifier, or some other circuit that makes a switching decision based on the level of an input signal wherein a threshold is used to control the switching decision.

Figure 4:
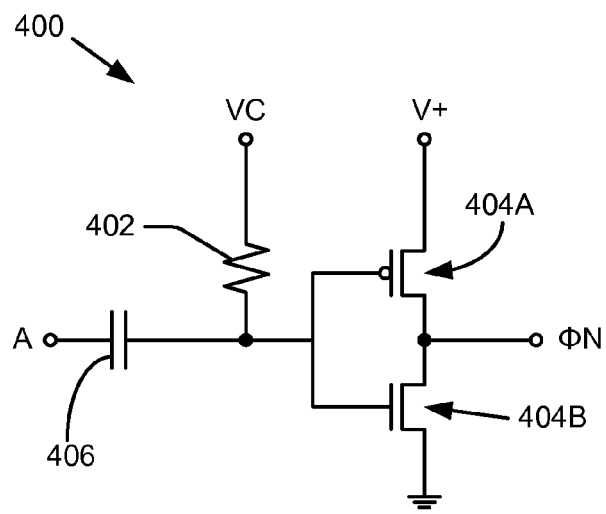
FIG. 4 is a simplified diagram of several sample aspects of a signal generator circuit configured to provide a multiphase signal.

FIG. 4 illustrates an example where an adjustable threshold in the form of a control signal VC controls the phase of an output signal ϕN of a transistor circuit 400 (e.g., an inverter). In this example, the control signal VC is coupled via a resistor 402 to gates of transistors 404A and 404B to control a bias level of the transistor circuit 400. The level of the bias of the transistor circuit 400, in turn, determines a switching decision level of the transistor circuit 400. Thus, in a similar manner as illustrated in FIG. 3, when an input signal A crosses this decision level the transistor circuit 400 provides a transition at the output signal ϕN.

As illustrate in FIG. 4, in some implementations the signal from the oscillator circuit (e.g., input signal A) is AC-coupled to the gates of the transistors 404A and 404B via a capacitive element (e.g., a capacitor) 406. In this way, the oscillator circuit may be decoupled from the transistor circuit 400, thereby reducing any potential loading of the oscillator circuit by the transistor circuit 400.

Figure 5:
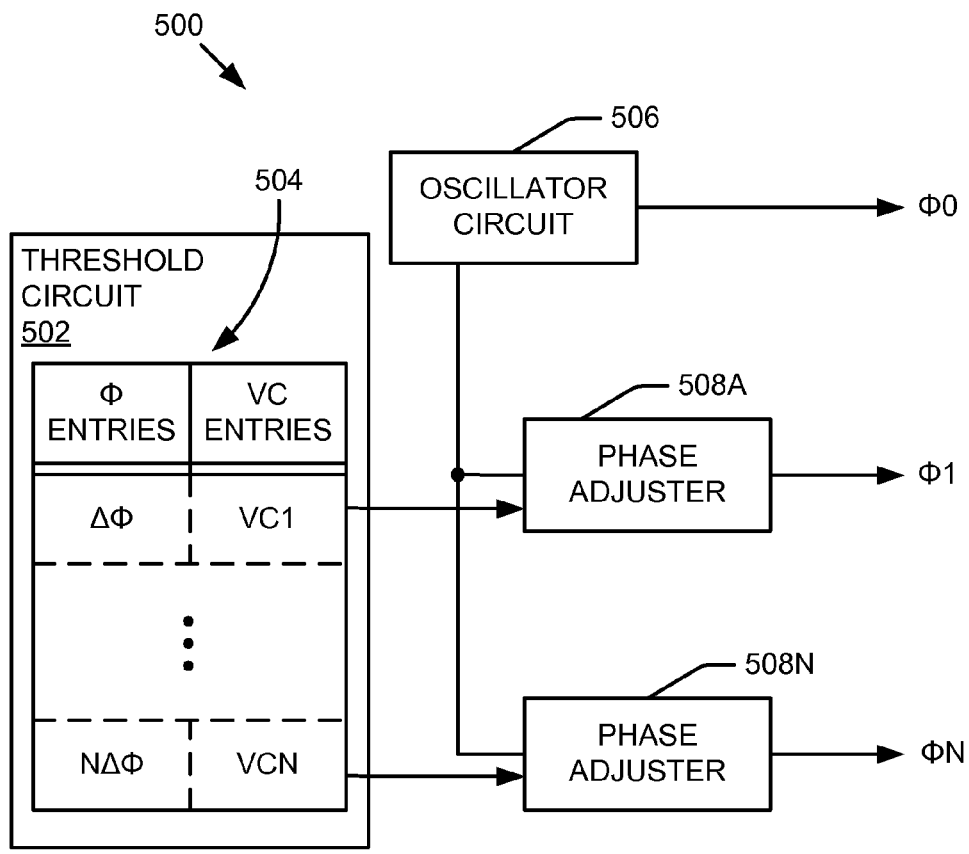
FIG. 5 is a simplified diagram of several sample aspects of a signal generator circuit configured to provide multiphase signals.

Referring to FIG. 5, in some implementations a signal generator 500 may include a threshold circuit 502 that incorporates or otherwise has access to a look-up table or some other suitable data structure 504 (e.g., stored in a data memory) to define one or more output signal phases for the signal generator 500. For example, a look-up table 504 may include information representative of one or more threshold values (e.g., control voltage entries VC1-VCN) that may be associated with one or more phase entries Δϕ-NΔϕ. Here, selection of a particular control voltage may provide a desired phase shift as represented by the symbol Δϕ. The stored information may take various forms. For example, in some implementations the stored information may comprise the actual values of the thresholds. In other implementations the stored information may comprise offset values (e.g., relative to an adjacent value in the look-up table 504).

In the example of FIG. 5, an oscillator circuit 506 generates an oscillating signal (e.g., similar to signal A in FIG. 2) that is phase delayed by one or more phase adjusters 508A-508N (collectively, "phase adjusters 508"). In this case, the phase of an output signal (e.g., output signals ϕ1-ϕN) generated by each of the phase adjusters 508 may be controlled based on one or more entries of the look-up table 504.

The look-up table 504 or other similar structure may be advantageously employed in implementations where a given device may, in effect, concurrently communicate with multiple devices. For example, in some implementations an ultrawideband receiver may concurrently receive pulse streams from different transmitters where each pulse stream employs relatively high inter-pulse duty cycling. In this case, the receiver may continually switch between the different pulse streams (e.g., on a pulse-by-pulse basis) to recover the pulses transmitted by the different transmitters. Consequently, the receiver may store phase information for each of the pulse streams in the look-up table 504 and access one of the entries whenever the receiver elects to receive a pulse from a given one of the pulse streams.

The look-up table 504 may be implemented in a variety of ways. For example, in some implementations the look-up table 504 may comprise an J/O register whereby selection of a particular register address results in the I/O register outputting a given signal level. Alternatively, in some implementations the look-up table information may simply be stored in a data memory. In this case, each of the phase adjusters 508 may be configured with an appropriate value from the look-up table 504 to set the phase of the phase adjuster.

In some implementations the entries in the look-up table 504 may be provided by a control circuit that determines the values that should be placed in the look-up table 504. For example, in implementations where the circuit 500 is incorporated in a tracking loop, when the tracking loop synchronizes to a given signal, the tracking loop may place an entry into the look-up table 504 that is associated with the particular signal with which the tracking loop has synchronized. In this way, in the event the tracking loop needs to resynchronize with that signal, the tracking loop may refer to the corresponding value stored in the look-up table 504.

In some implementations the look-up table 504 may be configured to provide any of the control voltage entries to any of the phase adjusters 508. For example, the phase adjuster 508A may be configured using any the control voltages VC1-VCN. Similarly, the phase adjuster 508N may be configured using any the control voltages VC1-VCN.

In some implementations the look-up table 504 may be configured to provide a specific one of the control voltage entries to a corresponding one of the phase adjusters 508. For example, the control voltage VC1 may be provided to the phase adjuster 508A while the control voltage VCN may be provided to the phase adjuster 508N. Such an implementation may be used to provide, for example, a multiphase clock bus where the output signals φ1-φN comprise each leg of the multiphase clock bus.

In view of the above, it should be appreciated that a signal generator may be employed in a variety of applications. For example, a signal generator employing a single adjustable phase branch (e.g., φ1) may be used to generate a clock signal whereby the phase of the clock signal may be selectively skewed, as necessary, by adjusting the control voltage VC1. In addition, a signal generator employing several phase branches (e.g., φ1-φN, where N is the number of phase branches) may provide several signals where each signal has a different phase as defined by a respective one of the control voltages VC1-VCN. As mentioned above, such a configuration may be employed to provide a multiphase clock bus.

Figure 6:
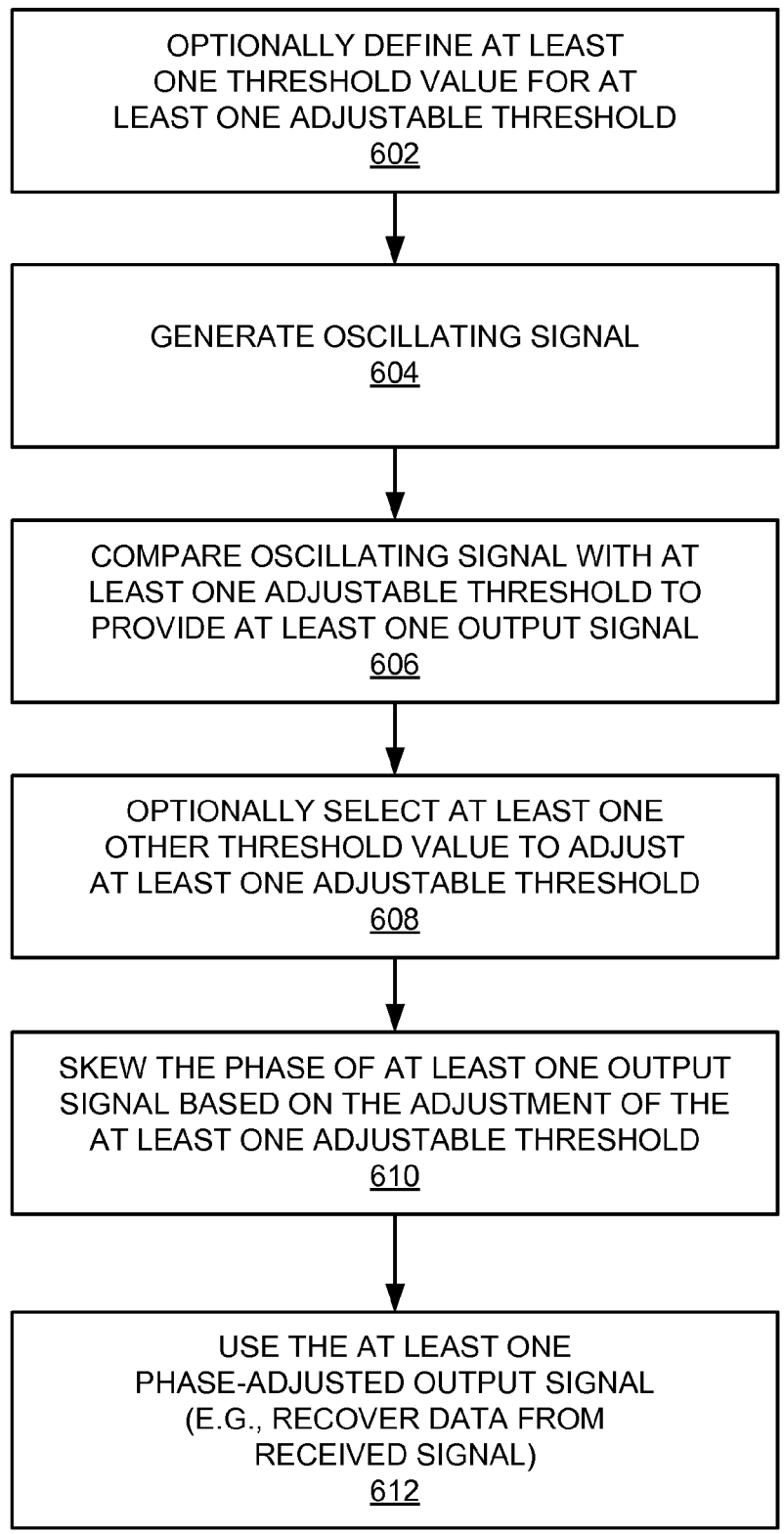
FIG. 6 is a flowchart of several sample aspects of operations that may be performed to provide at least one multiphase signal.

Sample operations of a signal generator (e.g., the circuit 200) will now be described in conjunction with the flowchart of FIG. 6. For convenience, the operations of FIG. 6 (or any other operations discussed or taught herein) may be described as being performed by specific components (e.g., the circuit 200). It should be appreciated, however, that these operations may be performed by other types of components and may be performed using a different number of components. It also should be appreciated that one or more of the operations described herein may not be employed in a given implementation.

As represented by block 602, the signal generator may optionally define one or more threshold values or other suitable information (e.g., control voltages) for defining one or more adjustable thresholds (e.g., reference signals) that are used to skew the phase of one or more output signals. At block 604, the signal generator provides an oscillating signal. This oscillating signal may comprise, for example, the input signal A of FIG. 2. An output signal generator (e.g., a comparator) compares the oscillating signal with the adjustable threshold(s) to provide the output signal(s) (block 606). At block 608, at some point in time a threshold generator (e.g., circuit 502) may select one or more new threshold values to adjust the thresholds. Accordingly, at block 610 the phase of each output signal is skewed as a result of the adjustment of a corresponding threshold. As represented by block 612, each output signal may then be employed in a corresponding circuit to provide the desired signal processing. For example, as will be discussed in more detail below in some implementations the output signal may comprise a clock signal that is used to recover data from received signals.

Figure 7:
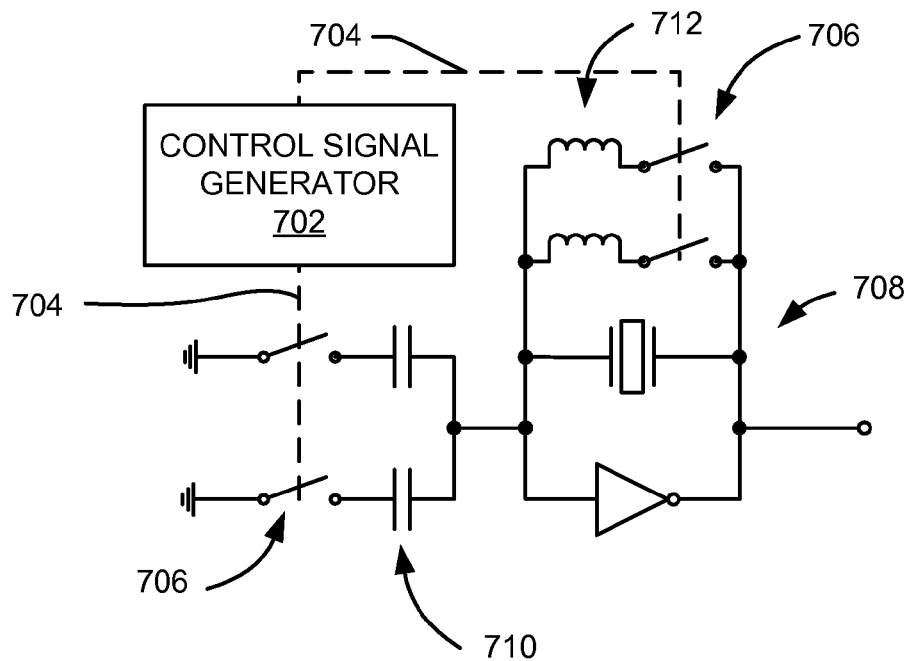
FIG. 7 is a simplified diagram of several sample aspects of a signal generator circuit configured to provide an adjustable phase and/or frequency signal.
Figure 8:
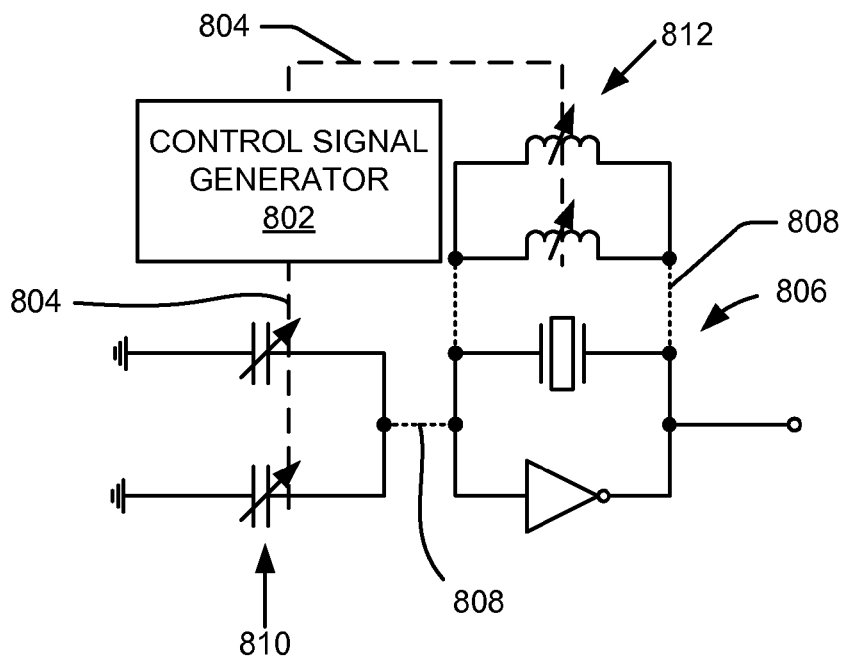
FIG. 8 is a simplified diagram of several sample aspects of a signal generator circuit configured to provide an adjustable phase and/or frequency signal.

Referring now to FIGS. 7 and 8, in some aspects the frequency of a signal generated by an oscillator circuit may be changed by reconfiguring a reactive circuit that is coupled to the oscillator circuit. For example, a control circuit may be configured to dynamically change the capacitance and/or the inductance of the oscillator circuit to thereby change the operating frequency of the oscillator circuit. FIG. 7 illustrates an example where one or more reactive elements may be selectively coupled to or decoupled from an oscillator circuit to cause a change in the capacitance and/or inductance of the oscillator circuit. Conversely, FIG. 8 illustrates an example where adjustable reactive elements are coupled to an oscillator circuit, whereby the reactance of each of these components may be adjusted to cause a change in the capacitance and/or inductance of the oscillator circuit.

In FIG. 7, a control circuit comprising a control signal generator 702 may control (e.g., as represented by the dashed lines 704) one or more switches 706 of a reactive circuit, where the switches 706 are adapted to selectively couple a variable reactance to an oscillator circuit 708. The reactive circuit may comprise, for example, one or more capacitive elements (e.g., capacitors) 710, one or more inductive elements (e.g., inductors) 712, or a combination of one or more capacitive elements 710 and one or more inductive elements 712. Here, each switch 706 may comprise a transistor or some other suitable device that may be controlled by a control signal 704 to selectively make or break an electrical signal path of the reactive circuit.

In FIG. 8, a control circuit comprising a control signal generator 802 may drive (e.g., as represented by the dashed lines 804) a control input of a variable reactive component that is coupled to an oscillator circuit 806. As represented by the dotted lines 808 in FIG. 8, in some implementations the variable reactive component may comprise one or more variable capacitive elements 810, one or more variable inductive elements 812, or a combination of one or more variable capacitive elements 810 and one or more variable inductive elements 812. In this case, the magnitude or some other characteristic of the control signal may affect an internal circuit of each adjustable capacitive element or adjustable inductive element which, in turn, may cause a corresponding change in the effective capacitance or inductance of the adjustable capacitive element or the adjustable inductive element, respectively.

In some aspects the frequency and/or the phase of an oscillating signal generated by an oscillator circuit may be adjusted by temporarily reconfiguring a reactive circuit that is associated with the oscillator circuit. For example, a control signal that controls the configuration of the reactive circuit may be toggled relatively quickly thereby causing a temporary change in the capacitance and/or the inductance of the oscillator circuit. This temporary change in the reactance of the circuit, in turn, leads to a temporary change in the frequency of the oscillating signal.

Figure 9:
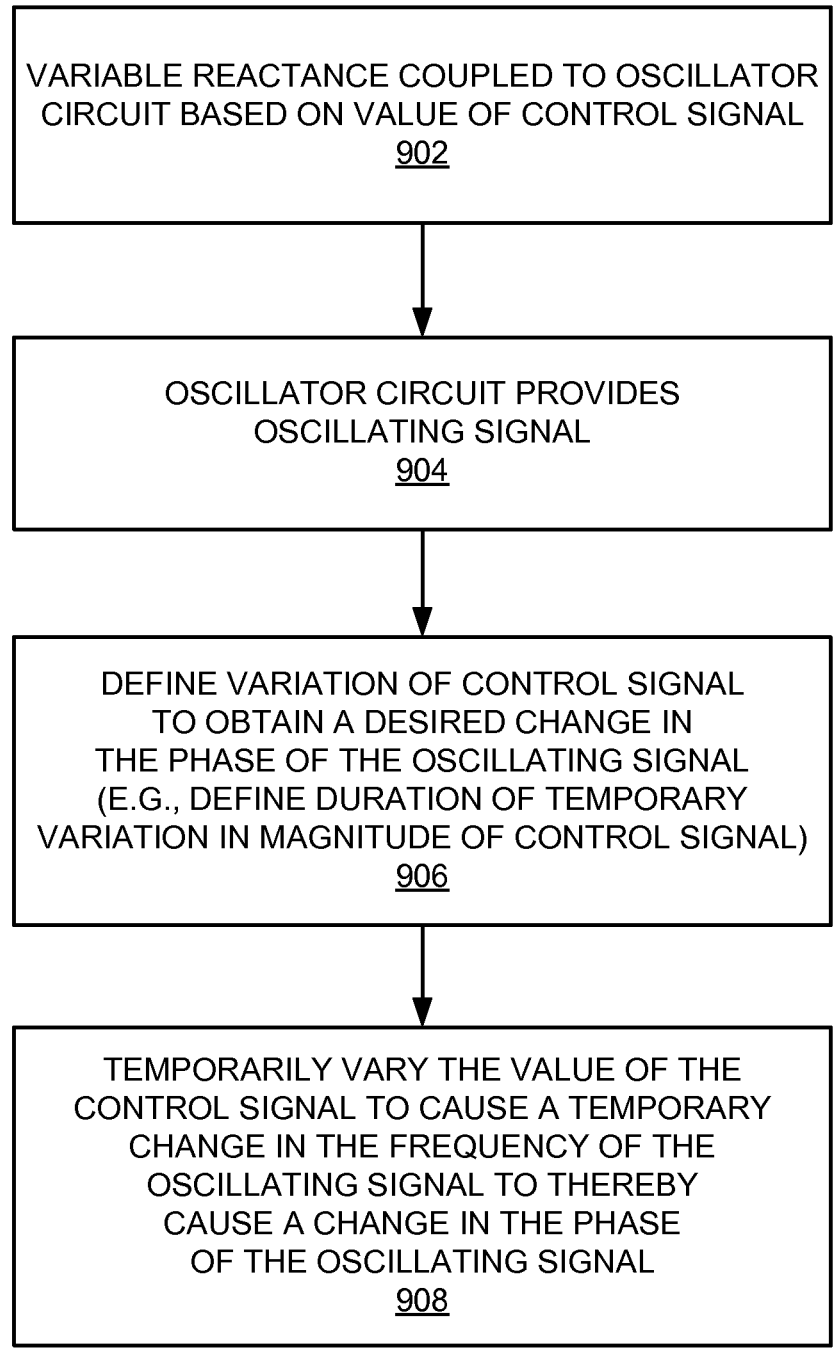
FIG. 9 is a flowchart of several sample aspects of operations that may be performed to skew the phase of a signal.
Figure 10:
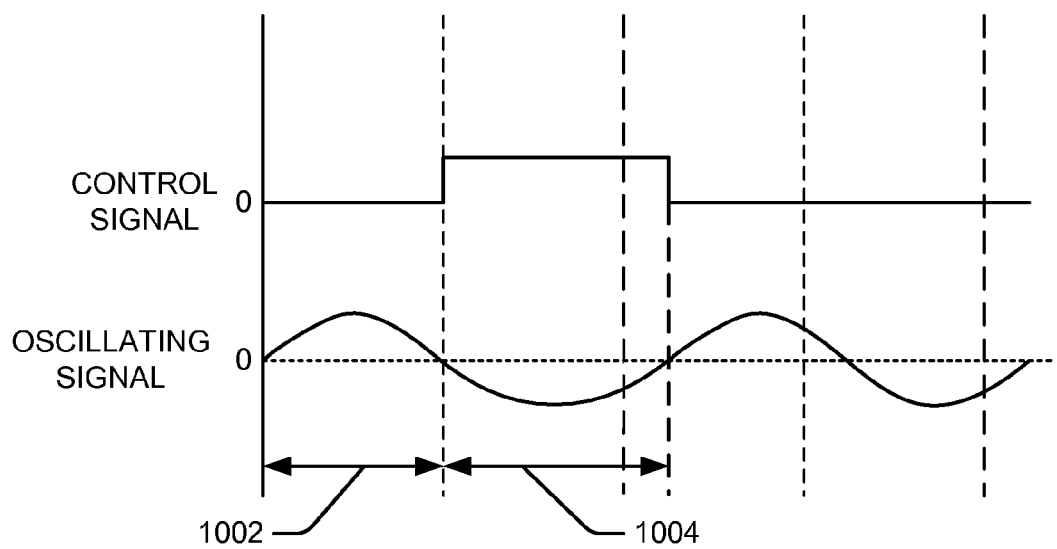
FIG. 10 is a simplified timing diagram illustrating a sample skewing of the phase of a signal.
Figure 11:
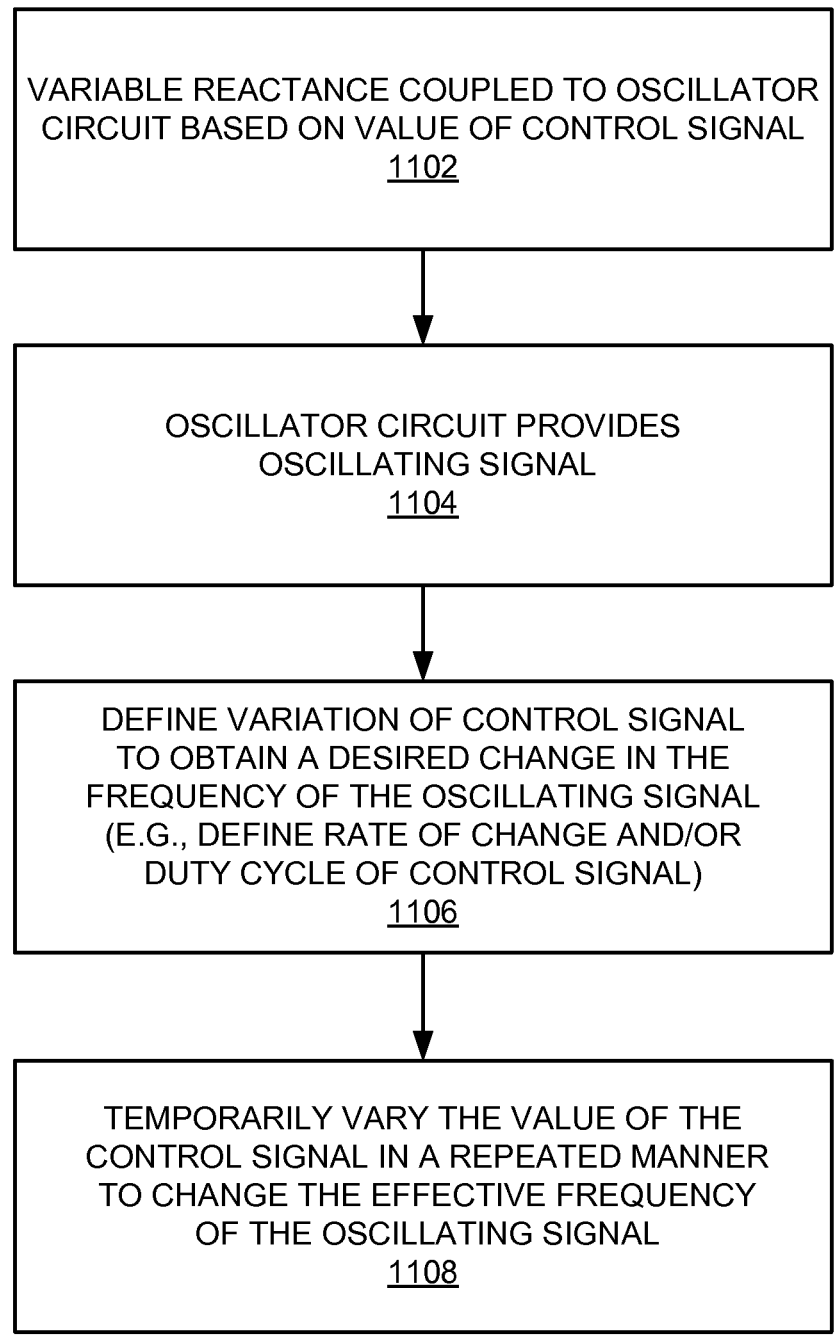
FIG. 11 is a flowchart of several sample aspects of operations that may be performed to adjust the effective frequency of a signal.

Referring now to FIGS. 9-12, a signal generator may employ a temporary change in frequency to change the phase or the frequency of an oscillating signal. Specifically, FIG. 9 describes several sample operations that may be employed to change a phase of a signal by temporarily changing the frequency of the signal as illustrated, for example, in FIG. 10. FIG. 11 describes several sample operations that may be employed to change a frequency of a signal by repeatedly causing temporary changes in the frequency of the signal as illustrated, for example, in FIG. 12.

Referring initially to FIG. 9, as represented by blocks 902 and 904 an oscillator circuit may be coupled to one or more reconfigurable reactive elements whereby the frequency of the oscillating signal output by the oscillator circuit may be changed by reconfiguring the reactive elements. As an example, the oscillator circuit may be configured as illustrated in FIG. 7 or FIG. 8 whereby the frequency of the oscillating output signal is controlled through the use of one or more control signals.

As represented by block 906, a temporary change in the control signal may be defined to provide a desired change in the phase of the output signal. For example, the control signal may initially be set to an original value, then changed to another value for a relatively short period of time, and then changed back to the original value. As represented by block 908, this temporary change in the control signal causes a temporary change in the frequency of the oscillator circuit which, in turn, results in a shift of the timing of the output signal.

A simplified timing diagram of such a phase shifting operation is shown in FIG. 10. As illustrated by a comparison of time periods 1002 and 1004, it may be observed that a change in the magnitude of a control signal has caused a corresponding change in the frequency of an oscillating signal. As a result, after the control signal is returned back to its original value, the phase of the oscillating signal has been adjusted (i.e., delayed in this example) relative to the original phase of the oscillating signal.

In the example of FIG. 10, the control signal is adjusted for a period of time that is less than the time period of the oscillating signal. It should be appreciated, however, that in other scenarios the value the control signal may be adjusted for a longer or shorter period of time than illustrated in FIG. 10 (e.g., for several cycles or less).

Referring now to FIG. 11, in some implementations one or more control signals may be temporarily changed in a repeated manner to adjust the effective frequency of an oscillating signal. Such implementations may be employed, for example, to provide an oscillating signal that has an effective frequency that lies between two discrete (e.g., baseline) frequency values that may otherwise be provided by an oscillator circuit. For example, as represented by blocks 1102 and 1104, the oscillator circuit may be coupled to one or more reconfigurable reactive elements whereby the frequency of the oscillating signal output by the oscillator circuit may be changed by reconfiguring the reactive elements as discussed above. In some cases, however, the reactance may normally change in discrete steps. For example, in the circuit of FIG. 7, based on the operation of the switches 706, the operating frequency may change from one discrete frequency value to another discrete frequency value. In some scenarios, however, it may be desirable to provide an operating frequency that lies between these discrete frequency values.

As represented by block 1106 of FIG. 11, a series of temporary changes in the control signal may thus be defined to provide a desired change in the frequency of the output signal. For example, at block 1108 the control signal may be repeatedly switched between two or more values at a relatively fast rate. As a result, the frequency of the output signal may be repeatedly switched from one instantaneous frequency to another instantaneous frequency, where the instantaneous frequencies are based on the control signal values. These temporary changes in the frequency of the output signal may thus provide an output signal having an effective frequency that lies somewhere between the above instantaneous frequencies.

Figure 12:
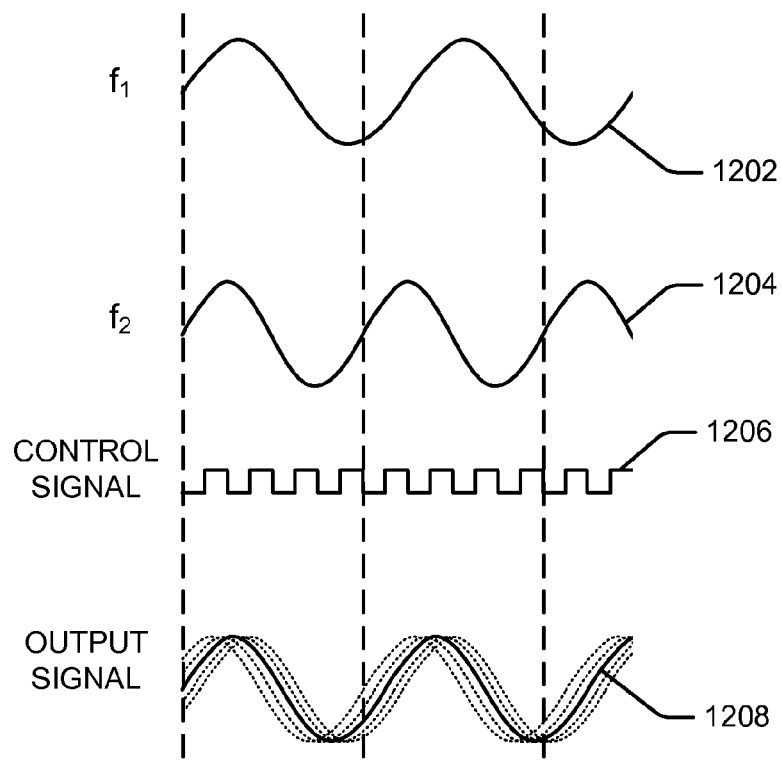
FIG. 12 is a simplified timing diagram illustrating a sample adjustment of the effective frequency of a signal.

A simplified timing diagram of such a frequency shifting operation is depicted in FIG. 12. Here, a waveform 1202 illustrates an instantaneous frequency associated with one value (e.g., a high value) of a control signal 1206. Conversely, a waveform 1204 illustrates an instantaneous frequency associated with another value (e.g., a low value) of the control signal 1206.

A waveform 1208 corresponding to an output signal (depicted in a conceptual form) illustrates that as a result of the duty cycling of the control signal 1206, an effective (e.g., average) frequency of the output signal 1208 may be greater than the frequency of the waveform 1202 and less than the frequency of the waveform 1204. In this example the duty cycle of the control signal 1206 is 50%. It should be appreciated, however, that a different duty cycle may be employed to achieve a different frequency at an output signal.

FIG. 12 illustrates that the waveform 1208 may have some amount of jitter (e.g., as represented by the use of multiple lines). Such jitter may not, however, significantly impact the operation of certain types of circuits such as, for example, a tracking loop in some implementations.

In general, any desired change in the frequency of the output signal may be achieved by controlling the rate at which the control signal is switched between different values and controlling the corresponding duty cycle associated with each of these values. In the example of FIG. 12, the value of the control signal is adjusted for periods of time that are each less than the time period of an input signal. It should be appreciated that in other scenarios the value the control signal may be adjusted for a longer or shorter period of time than illustrated in FIG. 12 (e.g., for several cycles or less).

From the above it should be appreciated that the phase and/or frequency of an output signal may be adjusted by a desired amount through appropriate selection of the quantity and values of the reactive components. In addition, the magnitude of the change in the phase and/or the frequency of the output signal may be dynamically controlled through appropriate control of the control signal. In other words, the phase and/or frequency of the output signal depends on the manner in which the reactive elements are reconfigured at a given point in time or over a period of time (e.g., how the switches are opened or closed in FIG. 7 or how the values of the control signals are adjusted in FIG. 8).

It should be appreciated that various modifications may be made to the circuits of FIGS. 7 and 8 based on the teachings herein. For example, the reactive components may be switched to other voltage points (e.g., other than ground). In addition, there may be a different number of reactive components used in a given implementation. For example, in an implementation that uses three capacitors a first capacitor may be used to increase the operating frequency, a second capacitor may be used to decrease the operating frequency, while a third capacitor may be used to provide a nominal frequency. Also, the values of the reactive elements may be selected to ensure that the circuit provides suitable incremental levels relating to the increase and decrease in oscillator frequency to compensate for any inaccuracies of the generated signals.

In some implementations a set of information relating to values of control signals (e.g., reference signals) may be used to specify a frequency or phase for one or more circuits such as those described in FIGS. 7 and 8. The control circuits 702 and 802 may then access this information to control the reactive elements. Such a set of information may be implemented and used, for example, in a similar manner as the table 504 discussed above. In some implementations a set of values may define specific frequencies and/or phases for a given oscillator circuit (e.g., one output signal). In some implementations a set of values may define specific frequencies and/or phases for a set of oscillator circuits (e.g., several output signals). In some implementations a set of values may define frequency and/or phase offsets (e.g., relative to neighboring entries in a table). In some implementations a set of values may define information relating to a time hopping sequence and/or a frequency hopping sequence.

In some aspects a circuit constructing in accordance with the teachings of FIGS. 7-12 may be used to provide a signal having controllable frequency and phase. For example, a first control scheme may be employed to generate control signals that provide the desired frequency and a second control scheme may be employed (e.g., concurrently) to generate control signals that provide a desired phase shift. Such a circuit may thus be used, for example, in a tracking loop that tracks the frequency and phase of an input signal.

Referring now to FIGS. 13-17, the disclosure relates in some aspects to signal synchronization and tracking. For example, the circuits and operations described above may be employed to adjust the phase and/or frequency of a given signal so that a given signal is synchronized with and tracks another signal.

Figure 13:
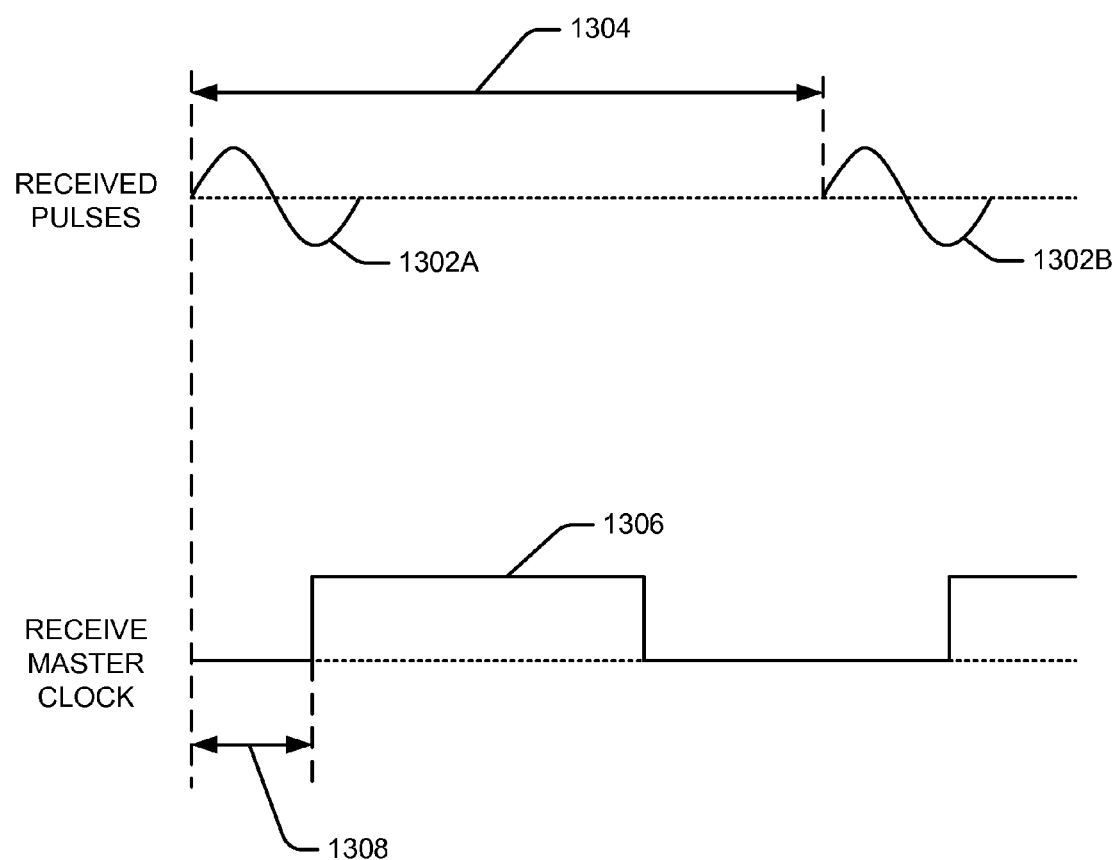
FIG. 13 is a simplified timing diagram illustrating sample out of phase signals.

FIG. 13 illustrates a simplified timing diagram for a pulse-based receiver (e.g., an ultra-wideband receiver, not shown in FIG. 13). Here, the received pulses 1302A and 1302B (collectively, "pulses 1302") are relatively narrow and are repeated at a pulse repetition interval ("PRI") as represented by line 1304. For example, in some implementations the width of each pulse 1302 may be on the order of 1 nanosecond or less (e.g., 100 picoseconds), while the pulse repetition interval 1304 may be on the order of 100 nanoseconds to 10 microseconds. It should be appreciated that these numbers are merely representative and that a given pulse-based system may employ different pulse widths and/or pulse repetition intervals.

If a typical receiver that employs PLL-based or DLL-based synchronization and tracking structure is used to recover data from the pulses 1302, the receiver may employ oscillators and components with specifications on the order of several gigahertz. In practice, this type of structure may be relatively complex and may consume a relatively significant amount of power. Hence, this type of receiver architecture may not be desirable for low-cost and/or low-power applications.

In contrast, through the use of structure and operations as taught herein, a relatively low-power and low-complexity receiver may be provided for recovering data (e.g., from pulse-based signals such as the pulses 1302). Advantageously, such a receiver may utilize a master clock signal 1306 that has a frequency on the order of 1/PRI or a small multiple of 1/PRI for recovering data from the received pulses 1302.

Initially, it may be observed from FIG. 13 that a phase shift may exist between the received pulses 1302 and the master clock 1306. As an example, the line 1308 illustrates a phase shift between a leading-edge of a received pulse and the rising edge of the master clock 1306. To effectively recover data from the received pulses 1302, a synchronization and tracking circuit may be employed to generate a clock signal that is synchronized with the received pulses 1302.

Figure 14:
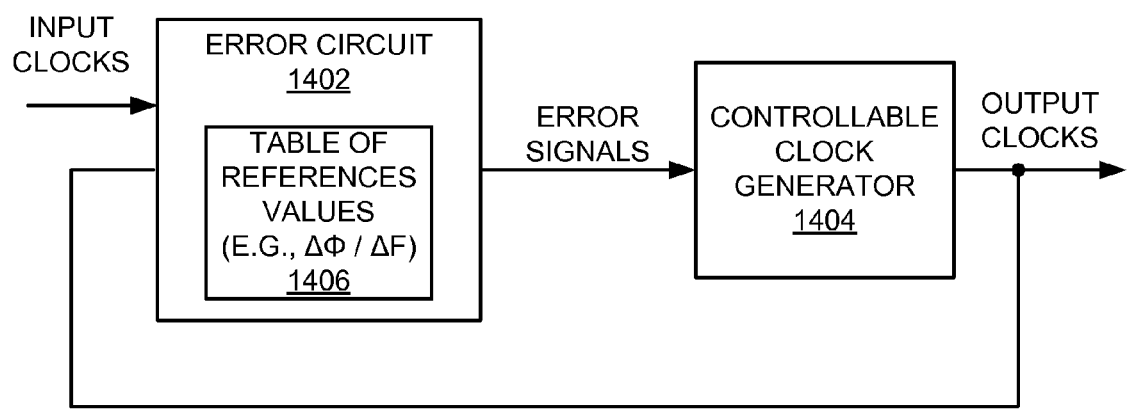
FIG. 14 is a simplified block diagram of several sample aspects of a tracking loop.

FIG. 14 illustrates, from a basic operational perspective, a circuit 1400 that generates one or more output clocks that may be synchronized with and track one or more input clocks.

Briefly, an error circuit 1402 compares the frequency and phase of an output clock with the frequency and phase of an input clock. In the event the frequency and/or phase of these clocks differ, the error circuit 1402 generates one or more error signals that control the frequency and phase of a controllable clock generator 1404 that generates the output clock.

In some aspects, the circuit 1400 may be configured to generate an output clock that has a defined phase and/or frequency difference from an input clock. To this end, the error circuit 1402 may comprise or may otherwise access a table of reference values that specify the desired difference in phase and/or frequency. In this case, the error circuit 1402 will take these reference values into account when generating the error signals.

Thus, through appropriate specification of the reference values 1406 (e.g., similar to look-up table 504), the circuit 1402 may provide one or more output clocks having a desired phase and/or frequency relative to one or more input clocks. In addition, the circuit 1402 may change the phase and/or frequency of a given signal whenever necessary by changing the reference values 1406. Consequently, the circuit 1400 may provide a tunable multiphase clock.

Figure 15:
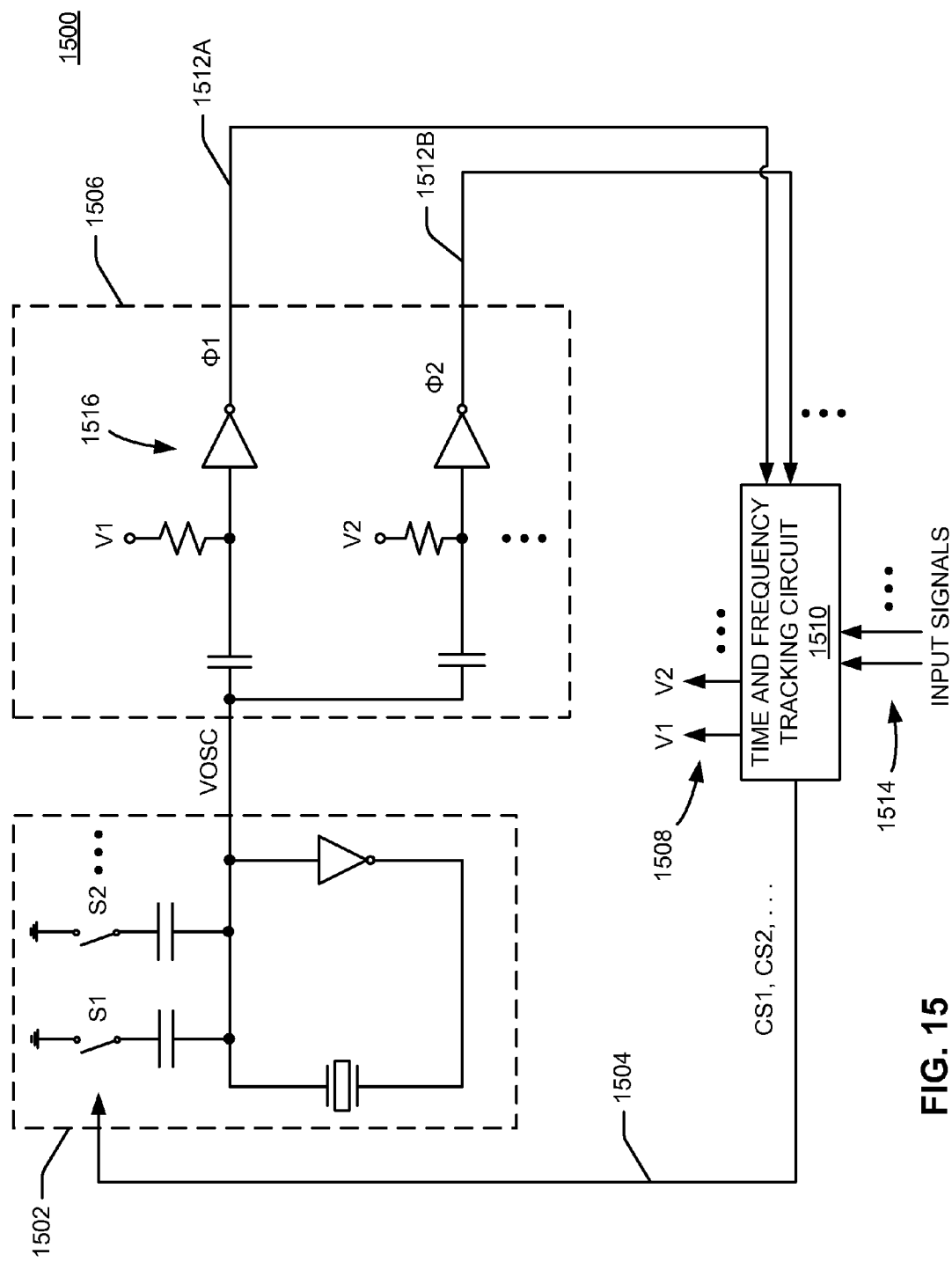
FIG. 15 is a simplified block diagram of several sample aspects of a tracking loop circuit.
Figure 16:
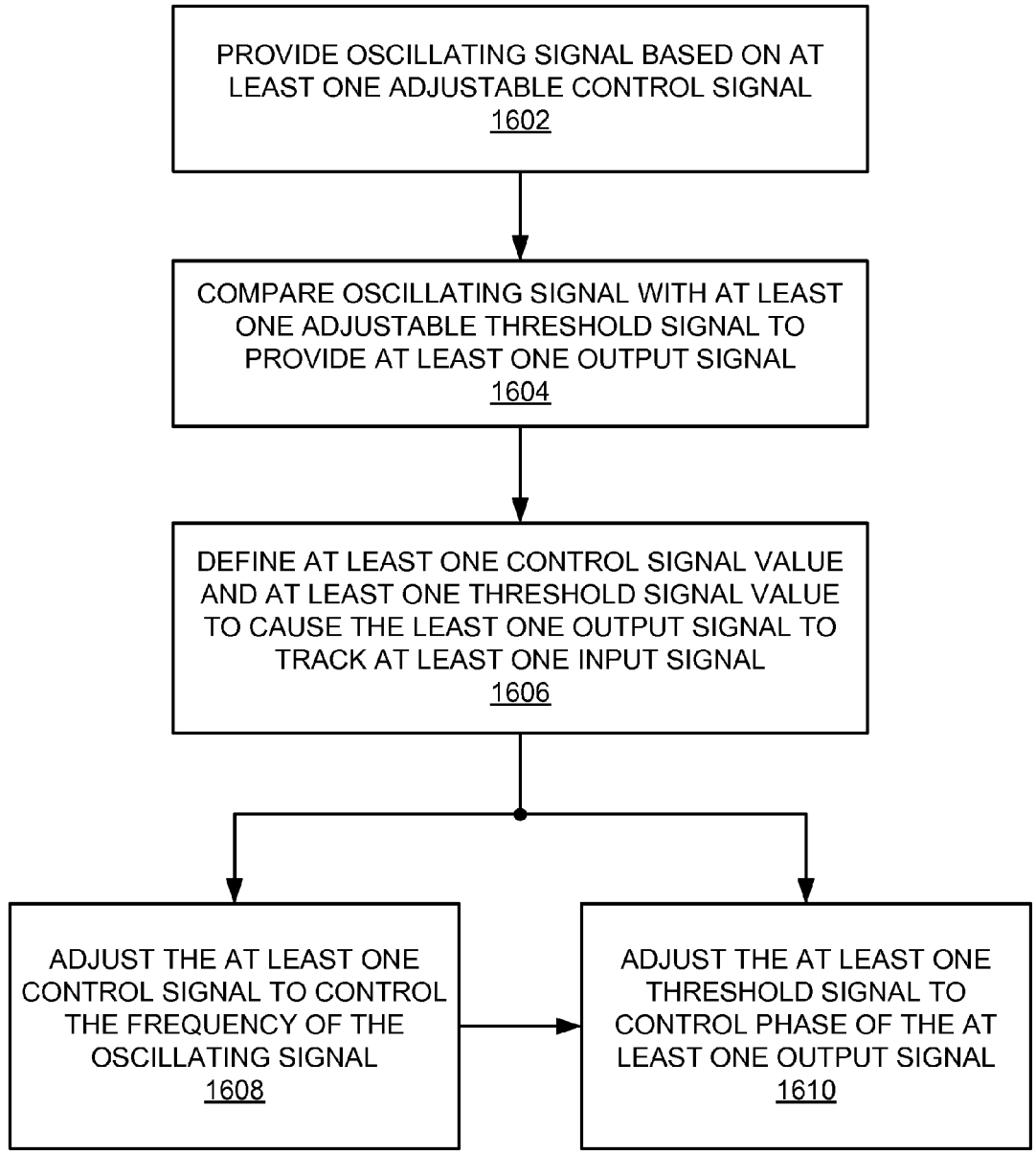
FIG. 16 is a flowchart of several sample aspects of operations that may be performed to track at least one signal.
Figure 17:
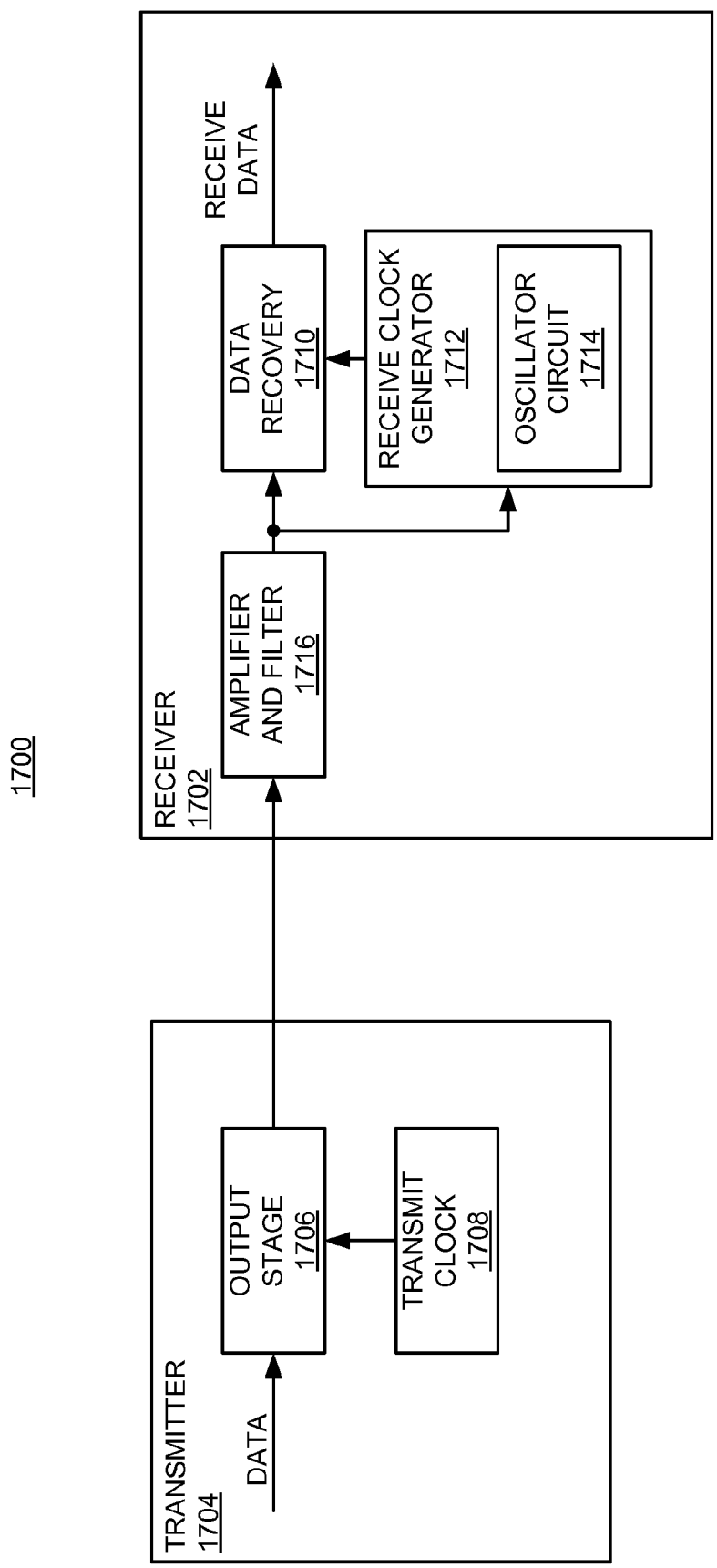
FIG. 17 is a simplified block diagram of several sample aspects of a communication system.

Referring now to FIG. 15, an implementation of a tracking loop circuit 1500 that may employ structure described above in conjunction with FIGS. 2-12 is shown. Briefly, the circuit 1500 includes a controllable oscillator circuit 1502 that generates an oscillating signal VOSC. In a similar manner as discussed above in conjunction with FIGS. 7-12, the frequency of the oscillating signal VOSC may be adjusted by operation of a set of control signals 1504 (e.g., one or more signals CS1, CS2, etc.). The circuit 1500 also includes a controllable phase adjust circuit 1506 that generates a set of output signals (e.g., one or more signals 1512A, 1512B, etc.) where the phases of these output signals may be adjusted by operation of a set of threshold signals 1508 (e.g., one or more signals V1, V2, etc.). Thus, the circuit 1506 may be similar to the circuits described above in conjunction with FIGS. 2-6.

The circuit 1500 also includes a time and frequency tracking circuit 1510 that adjusts the set of control signals 1504 and the set of threshold signals 1508 so that the set of output signals 1512 (e.g., signals 1512A and 1512B) are synchronized to and track a set of input signals 1514. As an example, the circuit 1510 may utilize early/late signal tracking contract a given input signal 1514. As represented by the ellipsis in FIG. 15, in practice the circuit 1500 may comprise any number of input signals 1514, output signals 1512, control signals 1504, and threshold signals 1508. Sample operations of the circuit 1500 will be described in more detail in conjunction with the flowchart of FIG. 16.

As represented by block 1602, the circuit 1502 provides an oscillating signal VOSC that has a frequency that is based on the current values of the set of control signals 1504. That is, as discussed above in conjunction with FIGS. 7-12, the set of control signals 1504 may control the operation of a set of switches (e.g., one or more switches S1, S2, etc.). The operation of the set of switches, in turn, controls the reactance (e.g., the capacitance) of the oscillator circuit 1502 to control the frequency of the oscillating signal VOSC.

As represented by block 1604, the circuit 1506 compares the oscillating signal VOSC with the set of adjustable threshold signals 1508 to provide the set of output signals 1512. As discussed above in conjunction with FIGS. 2-6, a set of devices (e.g., inverters) 1516 may compare the set of threshold signals 1508 (e.g., bias signals) with the oscillating signal VOSC to adjust the phase(s) of the set of output signals 1512.

As represented by block 1606, the tracking circuit 1510 continually ensures that the set of output signals 1512 track the set of input signals 1514. To this end, the tracking loop compares the set of output signals 1512 with the set of input signals 1514 to determine whether the phase and/or the frequency of the set of output signals 1512 needs to be changed. If so, the tracking circuit 1510 defines new values for the control signals and/or the threshold signals (e.g., defined based on an error signal) so that the set of output signals 1512 track the set of input signals 1514.

As represented by block 1608, the tracking circuit 1510 may then adjust the set of control signals 1504, as necessary, to fine tune the resonant frequency of the crystal oscillator. In this way, a slow frequency tracking mechanism is provided for the circuit 1500 by controlling the positions of the switches S1, S2, etc. In addition, as discussed above, duty cycling modulation may be used to correct offsets that may not be directly obtained by a single configuration of the switches.

As represented by block 1610, the tracking circuit 1510 also may adjust the set of threshold signals 1508, as necessary, to change the phase of the set of output signals 1512. Thus, a fast time tracking mechanism is also provided for the circuit 1500.

In a similar manner as discussed above the circuit 1500 may employ a table of information (e.g., reference values) for defining phase offsets and/or different frequencies (e.g., through the use of a frequency divider circuit, not shown) for one or more of the output signals 1512. For example, in some implementations the tracking circuit 1510 may define (e.g., repeatedly adapt) the entries in the table that are used to generate the control signals 1504 and the threshold signals 1508. For example, once the tracking circuit 1510 determines that it has synchronized a given output signal 1512 with a given input signal 1514, the tracking circuit 1510 may store information (e.g., one or more reference values) associated with the current values of one or more of the control signals 1504 and the threshold signals 1508 that caused the current frequency and/or phase of the given output signal 1512. In some implementations, stored reference values may be used to adjust the frequency and/or phase of a given output signal 1512 to one of several different defined values. In addition, in an implementation where multiple output signals 1512 are provided, the reference values may be used to define a unique frequency and/or phase for each of the output signals 1512.

The circuit 1500 may be configured in a variety of ways to provide a desired number of output signals 1512. For example, in some applications the circuit 1500 may provide multiphase clocks 1512 based on a single input signal 1514. Alternatively, in some applications the circuit 1500 may provide multiphase clocks 1512 where each clock is synchronized with and tracks a corresponding one of several input signals 1514.

It should be appreciated that various modifications may be made to the circuit 1500 based on the teachings herein. For example, the circuit 1502 may employ different combinations of reactive elements (e.g., capacitors and/or inductors) and different types of reactive elements (e.g., variable reactive elements) as discussed above. Also, the circuit 1506 may employ different types of comparators 1516 for generating the output signals 1512.

A synchronization and tracking circuit as discussed herein may be employed in a variety of applications. For example, referring to the communication system 1700 of FIG. 17, a receiver 1702 may comprise a synchronization and tracking circuit as taught herein to recover data from signals received from a transmitter 1704.

Here, an output stage 1706 of the transmitter 1704 may transmit data to the receiver 1702 based on a transmit clock 1708. Thus, the timing of the signal received by the receiver 1702 is based on the frequency of the transmit clock 1708.

The receiver 1702 includes a data recovery component (e.g., circuit) 1710 that recovers data from the received signals based on an appropriately time receive clock generated by a receive clock generator 1712. The receive clock generator 1712 may, in turn, utilize a synchronization and tracking circuit to adjust the frequency and phase of a clock generated by an oscillator circuit 1714 (e.g., a crystal oscillator circuit as discussed herein).

In operation, the received data signal is provided to an amplification and filtering component 1716 that provides the conditioned received data signal to the data recovery component 1710 and the receive clock generator 1712. Thus, the received data signal may comprise the set of input signals 1514 of FIG. 15 that the receive clock generator 1712 compares with its generated receive clock signals (e.g., the set of output signals 1512 of FIG. 15). Consequently, the receive clock generator 1712 will adjust the values of its control and threshold signals, as necessary, so that the receive clock signal is synchronized with and tracks the received data signal. In this way, the data recovery component 1710 may be provided with a receive clock signal that may be effectively used to extract the data from the received data signals.

Figure 18:
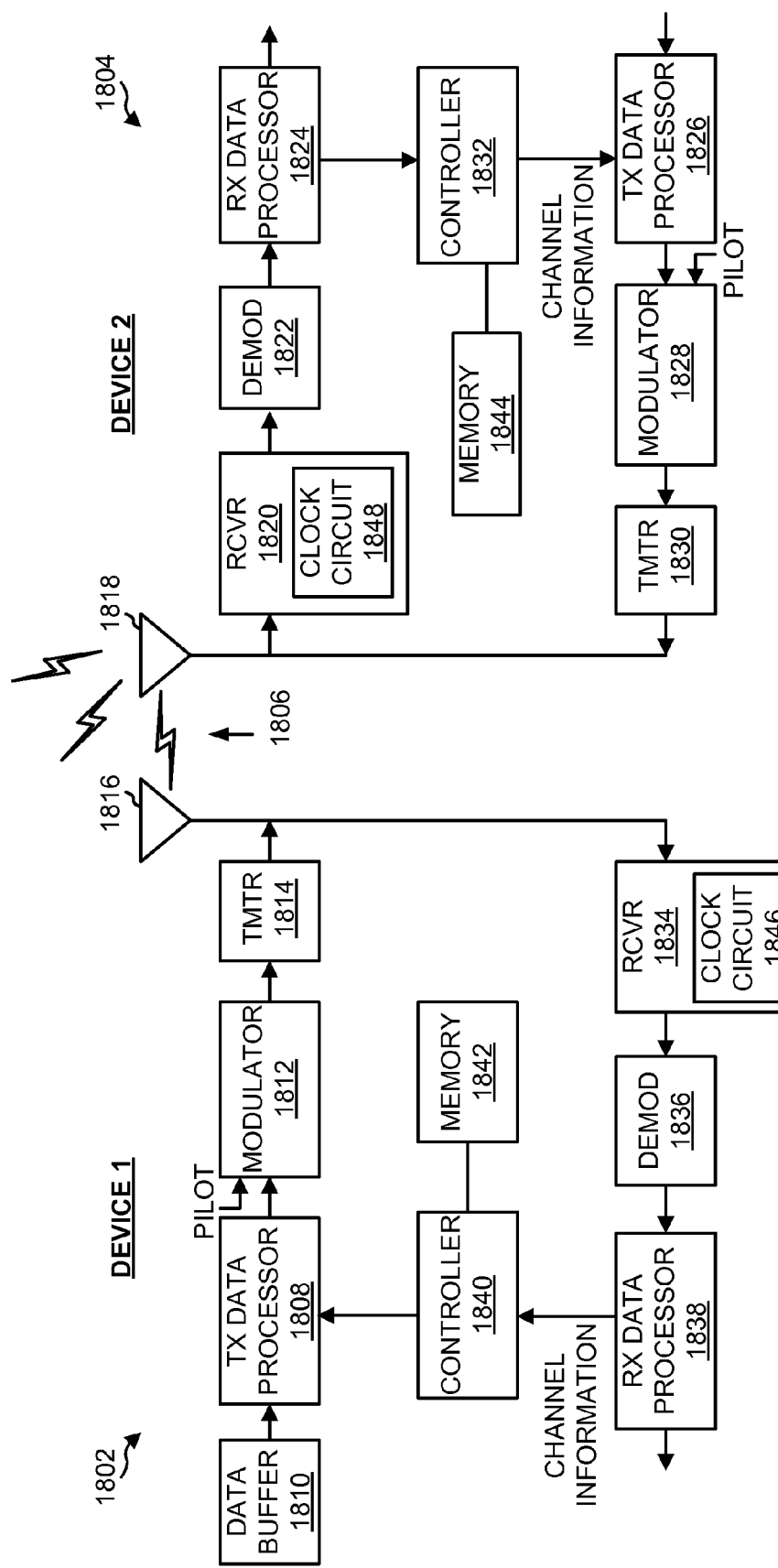
FIG. 18 is a simplified block diagram of several sample aspects of communication components.

The teachings herein may be incorporated into a device employing various components for communicating with at least one other device. FIG. 18 depicts several sample components that may be employed to facilitate communication between devices. Here, a first device 1802 and a second device 1804 are adapted to communicate via a wireless communication link 1806 over a suitable medium.

Initially, components involved in sending information from the device 1802 to the device 1804 (e.g., a reverse link) will be treated. A transmit ("TX") data processor 1808 receives traffic data (e.g., data packets) from a data buffer 1810 or some other suitable component. The transmit data processor 1808 processes (e.g., encodes, interleaves, and symbol maps) each data packet based on a selected coding and modulation scheme, and provides data symbols. In general, a data symbol is a modulation symbol for data, and a pilot symbol is a modulation symbol for a pilot (which is known a priori). A modulator 1812 receives the data symbols, pilot symbols, and possibly signaling for the reverse link, and performs modulation (e.g., OFDM or some other suitable modulation) and/or other processing as specified by the system, and provides a stream of output chips. A transmitter ("TMTR") 1814 processes (e.g., converts to analog, filters, amplifies, and frequency upconverts) the output chip stream and generates a modulated signal, which is then transmitted from an antenna 1816.

The modulated signals transmitted by the device 1802 (along with signals from other devices in communication with the device 1804) are received by an antenna 1818 of the device 1804. A receiver ("RCVR") 1820 processes (e.g., conditions and digitizes) the received signal from the antenna 1818 and provides received samples. A demodulator ("DEMOD") 1822 processes (e.g., demodulates and detects) the received samples and provides detected data symbols, which may be a noisy estimate of the data symbols transmitted to the device 1804 by the other device(s). A receive ("RX") data processor 1824 processes (e.g., symbol demaps, deinterleaves, and decodes) the detected data symbols and provides decoded data associated with each transmitting device (e.g., device 1802).

Components involved in sending information from the device 1804 to the device 1802 (e.g., a forward link) will be now be treated. At the device 1804, traffic data is processed by a transmit ("TX") data processor 1826 to generate data symbols. A modulator 1828 receives the data symbols, pilot symbols, and signaling for the forward link, performs modulation (e.g., OFDM or some other suitable modulation) and/or other pertinent processing, and provides an output chip stream, which is further conditioned by a transmitter ("TMTR") 1830 and transmitted from the antenna 1818. In some implementations signaling for the forward link may include power control commands and other information (e.g., relating to a communication channel) generated by a controller 1832 for all devices (e.g. terminals) transmitting on the reverse link to the device 1804.

At the device 1802, the modulated signal transmitted by the device 1804 is received by the antenna 1816, conditioned and digitized by a receiver ("RCVR") 1834, and processed by a demodulator ("DEMOD") 1836 to obtain detected data symbols. A receive ("RX") data processor 1838 processes the detected data symbols and provides decoded data for the device 1802 and the forward link signaling. A controller 1840 receives power control commands and other information to control data transmission and to control transmit power on the reverse link to the device 1804.

The controllers 1840 and 1832 direct various operations of the device 1802 and the device 1804, respectively. For example, a controller may determine an appropriate filter, reporting information about the filter, and decode information using a filter. Data memories 1842 and 1844 may store program codes and data used by the controllers 1840 and 1832, respectively.

FIG. 18 also illustrates that the communication components may include one or more components that provide signal generation functionality as taught herein. For example, the receiver 1834 may include a clock generator circuit 1846 and the receiver 1820 may include a clock generator circuit 1848.

A wireless device may include various components that perform functions based on data that is provided (e.g., transmitted or received) through the use of an output signal (e.g., an oscillating signal) that is generated as taught herein. For example, a wireless headset may include a transducer adapted to provide an audio output based on data that is provided through the use of an output signal. A wireless sensing device may include a sensor adapted to provide data to be transmitted through the use of an output signal. A wireless watch may include a user interface adapted to provide an indication based on data that is provided through the use of an output signal. As an example, a user interface may comprise a display screen, lighting elements (e.g., an LED device), a speaker, a temperature-based indicator, or some other suitable device that provides some form of indication (e.g., visual, audible, vibration-related, temperature-related, and so on) to a user.

A wireless device may communicate via one or more wireless communication links that are based on or otherwise support any suitable wireless communication technology. For example, in some aspects a wireless device may associate with a network. In some aspects the network may comprise a body area network or a personal area network (e.g., an ultra-wideband network). In some aspects the network may comprise a local area network or a wide area network. A wireless device may support or otherwise use one or more of a variety of wireless communication technologies, protocols, or standards such as, for example, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components (e.g., transmitter 108 and receiver 110) that may include various components (e.g., signal generators and signal processors) that facilitate communication over a wireless medium.

In some aspects a wireless device may communicate via an impulse-based wireless communication link. For example, an impulse-based wireless communication link may utilize ultra-wideband pulses that have a relatively short length (e.g., on the order of a few nanoseconds or less) and a relatively wide bandwidth. In some aspects the ultra-wideband pulses may have a fractional bandwidth on the order of approximately 20% or more and/or have a bandwidth on the order of approximately 500 MHz or more.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical sensing device (e.g., a biometric sensor, a heart rate monitor, a pedometer, an EKG device, etc.), a user I/O device (e.g., a watch, a remote control, a light switch, a keyboard, a mouse, etc.), an environment sensing device (e.g., a tire pressure monitor), a computer, a point-of-sale device, an entertainment device, a hearing aid, a set-top box, or any other suitable device.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses).

In some aspects a wireless device may comprise an access device (e.g., a Wi-Fi access point) for a communication system. Such an access device may provide, for example, connectivity to another network (e.g., a wide area network such as the Internet or a cellular network) via a wired or wireless communication link. Accordingly, the access device may enable another device (e.g., a Wi-Fi station) to access the other network or some other functionality. In addition, it should be appreciated that one or both of the devices may be portable or, in some cases, relatively non-portable.

Figure 19:
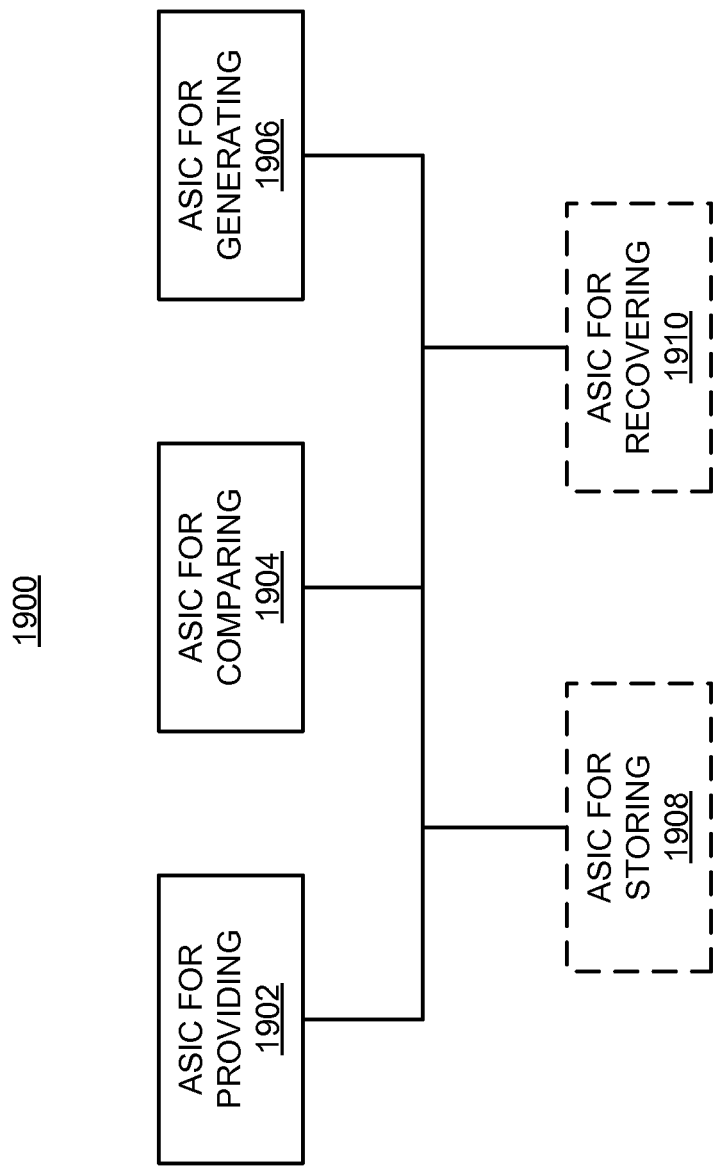
FIGS. 19-21 are simplified block diagrams of several sample aspects of apparatuses configured to provide one or more signals as taught herein.
Figure 20:
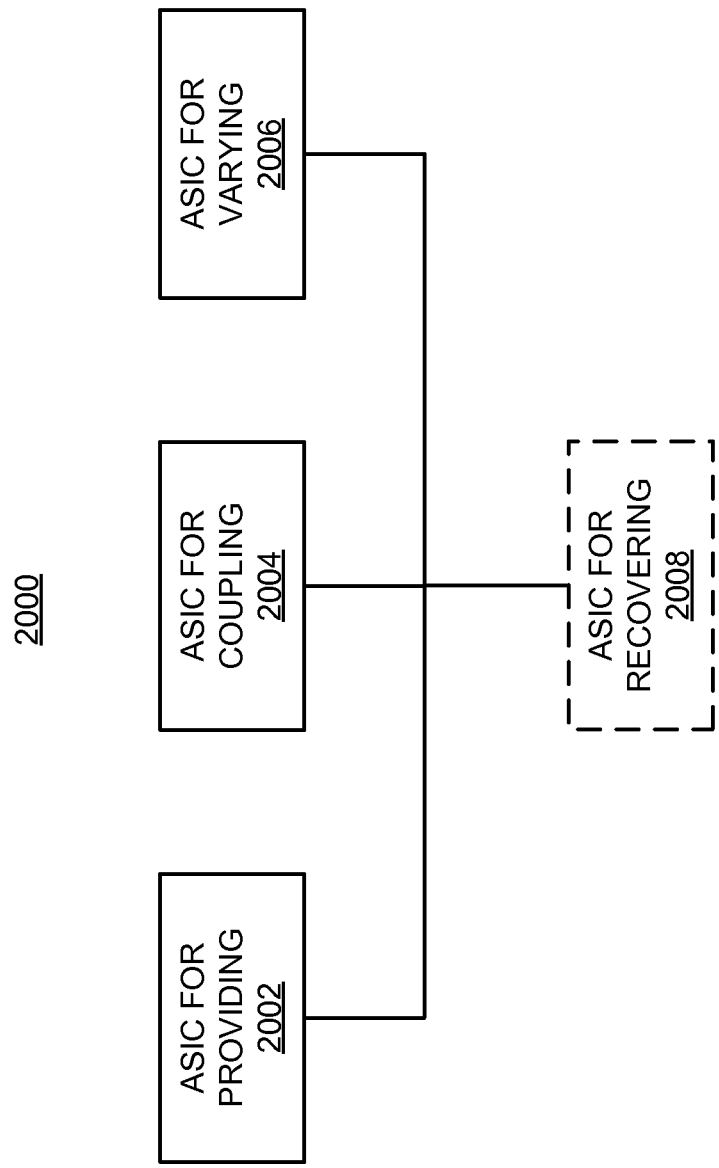
Figure 21:
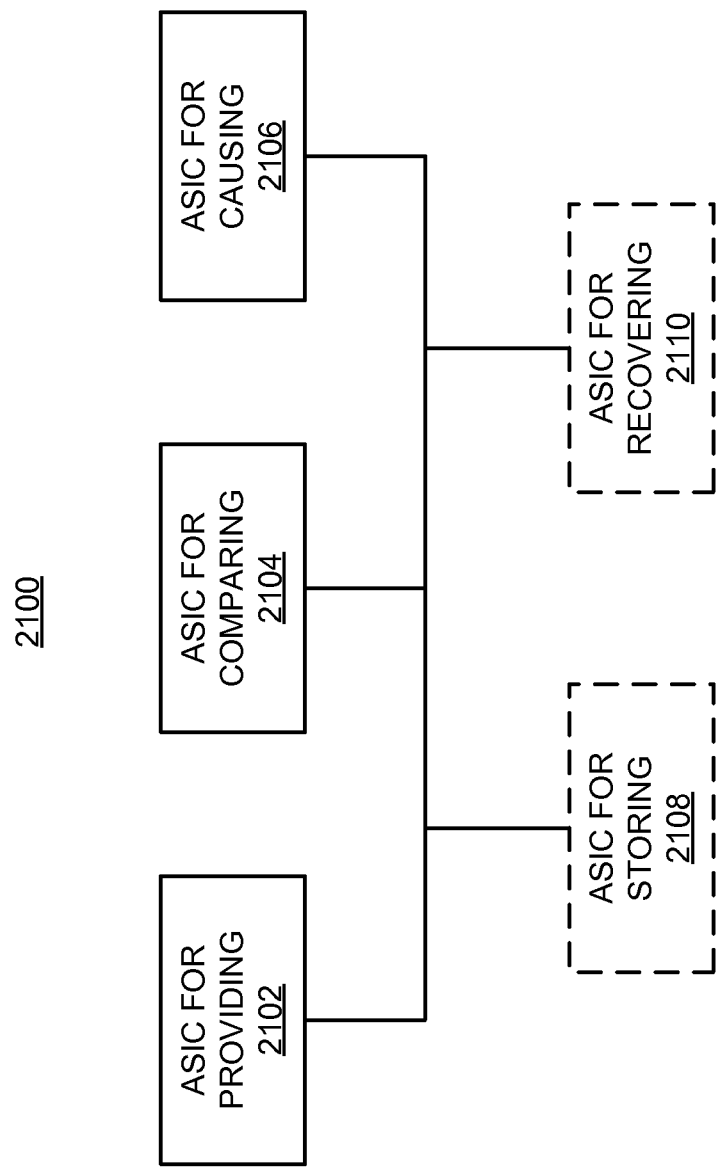

The components described herein may be implemented in a variety of ways. Referring to FIGS. 19-21, apparatuses 1900, 2000, and 2100 are represented as a series of interrelated functional blocks that may represent functions implemented by, for example, one or more integrated circuits (e.g., an ASIC) or may be implemented in some other manner as taught herein. As discussed herein, an integrated circuit may include a processor, software, other components, or some combination thereof.

The apparatuses 1900-2100 may include one or more modules that may perform one or more of the functions described above with regard to various figures. For example, an ASIC for providing, 1902, 2002, or 2102, may correspond to, for example, an oscillator circuit as discussed herein. An ASIC for comparing, 1904 or 2104, may correspond to, for example, a comparator as discussed herein. An ASIC for generating, 1906, may correspond to, for example, a threshold circuit as discussed herein. An ASIC for storing, 1908 or 2108, may correspond to, for example, a data memory as discussed herein. An ASIC for recovering, 1910, 2008, or

2110, may correspond to, for example, a data recovery circuit as discussed herein. An ASIC for coupling, 2004, may correspond to, for example, a reactive circuit as discussed herein. An ASIC for varying, 2006, may correspond to, for example, a control circuit as discussed herein. An ASIC for causing, 2106, may correspond to, for example, a time and frequency tracking circuit as discussed herein.

As noted above, in some aspects these components may be implemented via appropriate processor components. These processor components may in some aspects be implemented, at least in part, using structure as taught herein. In some aspects a processor may be adapted to implement a portion or all of the functionality of one or more of these components. In some aspects one or more of the components represented by dashed boxes are optional.

As noted above, the apparatuses 1900-2100 may comprise one or more integrated circuits. For example, in some aspects a single integrated circuit may implement the functionality of one or more of the illustrated components, while in other aspects more than one integrated circuit may implement the functionality of one or more of the illustrated components.

In addition, the components and functions represented by FIGS. 19-21 as well as other components and functions described herein, may be implemented using any suitable means. Such means also may be implemented, at least in part, using corresponding structure as taught herein. For example, the components described above in conjunction with the "ASIC for" components of FIGS. 19-21 also may correspond to similarly designated "means for" functionality. Thus, in some aspects one or more of such means may be implemented using one or more of processor components, integrated circuits, or other suitable structure as taught herein.

Also, it should be understood that any reference to an element herein using a designation such as "first," "second," and so forth does not generally limit the quantity or order of those elements. Rather, these designations are used herein as a convenient method of distinguishing between two or more different elements. Thus, a reference to first and second elements does not mean that only two elements may be employed there or that the first element must precede the second element in some manner. Also, unless stated otherwise a set of elements may comprise one or more elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. An apparatus for providing an output signal, comprising:
   an oscillator circuit configured to provide an oscillating signal;
   a comparator configured to compare the oscillating signal with an adjustable threshold to provide an output signal; and
   a threshold circuit configured to generate the adjustable threshold to skew a phase of the output signal to track a phase of another signal.

2. The apparatus of claim 1, further comprising:
   a data memory configured to store a set of adjustable threshold values, each of which is associated with a different phase offset for the output signal;
   wherein the threshold circuit is further configured to select one of the adjustable threshold values to skew the phase of the output signal.

3. The apparatus of claim 1, further comprising:
   at least one other comparator configured to compare the oscillating signal with at least one other adjustable threshold to provide at least one other output signal;
   wherein the threshold circuit is further configured to generate the at least one other adjustable threshold to skew a phase of each of the at least one other output signal.

4. The apparatus of claim 3, further comprising:
   a data memory configured to store a set of adjustable threshold values, each of which is associated with a different phase offset;
   wherein the threshold circuit is further configured to select at least one of the set of adjustable threshold values to skew the phases of the output signals.

5. The apparatus of claim 1, wherein:
   the comparator comprises an inverter having an adjustable decision threshold that determines a level of the oscillating signal that causes the inverter to switch polarity of the output signal; and
   adjustment of the adjustable threshold alters the decision threshold.

6. The apparatus of claim 1, wherein:
   the comparator comprises a transistor circuit having an adjustable bias; and
   adjustment of the adjustable threshold adjusts the bias.

7. The apparatus of claim 1, wherein the oscillator circuit comprises a crystal oscillator coupled in parallel with an inverter.

8. The apparatus of claim 1, wherein:
   the threshold circuit is implemented in a tracking loop; and
   the tracking loop is configured to skew the phase of the output signal to track the phase of another signal.

9. The apparatus of claim 8, wherein the another signal comprises a clock signal that is recovered from a received signal.

10. The apparatus of claim 1, wherein the oscillator circuit has a quality factor on the order of 10 or more.

11. The apparatus of claim 1, further comprising a data recovery circuit configured to recover data from ultra-wideband pulses based on the output signal.

12. The apparatus of claim 11, wherein the ultra-wideband pulses are associated with a fractional bandwidth on the order of 20% or more, a bandwidth on the order of 500 MHz or more, or a fractional bandwidth on the order of 20% or more and a bandwidth on the order of 500 MHz or more.

13. A method of providing an output signal, comprising:
   providing, by an apparatus, an oscillating signal;
   comparing the oscillating signal with an adjustable threshold to provide an output signal; and
   generating the adjustable threshold to skew a phase of the output signal to track a phase of another signal.

14. The method of claim 13, further comprising:
   storing a set of adjustable threshold values, each of which is associated with a different phase offset for the output signal;
   wherein the generation of the adjustable threshold comprises selecting one of the adjustable threshold values to skew the phase of the output signal.

15. The method of claim 13, further comprising:
   comparing the oscillating signal with at least one other adjustable threshold to provide at least one other output signal; and
   generating the at least one other adjustable threshold to skew a phase of each of the at least one other output signal.

16. The method of claim 15, further comprising:
   storing a set of adjustable threshold values, each of which is associated with a different phase offset;
   wherein the generation of the at least one other adjustable threshold comprises selecting at least one of the set of adjustable threshold values to skew the phases of the output signals.

17. The method of claim 13, wherein:
   the comparison is performed by an inverter that has an adjustable decision threshold that determines a level of the oscillating signal that causes the inverter to switch polarity of the output signal; and
   adjustment of the adjustable threshold alters the decision threshold.

18. The method of claim 13, wherein:
   the comparison is performed by a transistor circuit having an adjustable bias; and
   adjustment of the adjustable threshold adjusts the bias.

19. The method of claim 13, wherein the oscillating signal is provided by an oscillator circuit comprising a crystal oscillator coupled in parallel with an inverter.

20. The method of claim 13, wherein:
   the generation of the adjustable threshold is implemented in a tracking loop; and
   the tracking loop skews the phase of the output signal to track the phase of another signal.

21. The method of claim 20, wherein the another signal comprises a clock signal that is recovered from a received signal.

22. The method of claim 13, wherein an oscillator circuit that provides the oscillating signal has a quality factor on the order of 10 or more.

23. The method of claim 13, further comprising recovering data from ultra-wideband pulses based on the output signal.

24. The method of claim 23, wherein the ultra-wideband pulses are associated with a fractional bandwidth on the order of 20% or more, a bandwidth on the order of 500 MHz or more, or a fractional bandwidth on the order of 20% or more and a bandwidth on the order of 500 MHz or more.

25. An apparatus for providing an output signal, comprising:
   means for providing an oscillating signal;
   means for comparing the oscillating signal with an adjustable threshold to provide an output signal; and
   means for generating the adjustable threshold to skew a phase of the output signal to track a phase of another signal.

26. The apparatus of claim 25, further comprising:
   means for storing a set of adjustable threshold values, each of which is associated with a different phase offset for the output signal;

wherein the means for generating selects one of the adjustable threshold values to skew the phase of the output signal.

27. The apparatus of claim 25, wherein:
the means for comparing compares the oscillating signal with at least one other adjustable threshold to provide at least one other output signal; and
the means for generating generates the at least one other adjustable threshold to skew a phase of each of the at least one other output signal.

28. The apparatus of claim 27, further comprising:
means for storing a set of adjustable threshold values, each of which is associated with a different phase offset;
wherein the means for generating selects at least one of the set of adjustable threshold values to skew the phases of the output signals.

29. The apparatus of claim 25, wherein:
the means for comparing comprises an inverter having an adjustable decision threshold that determines a level of the oscillating signal that causes the inverter to switch polarity of the output signal; and
adjustment of the adjustable threshold alters the decision threshold.

30. The apparatus of claim 25, wherein:
the means for comparing comprises a transistor circuit having an adjustable bias; and
adjustment of the adjustable threshold adjusts the bias.

31. The apparatus of claim 25, wherein the means for providing comprises a crystal oscillator coupled in parallel with an inverter.

32. The apparatus of claim 25, wherein:
the means for generating is implemented in a tracking loop; and
the tracking loop is configured to skew the phase of the output signal to track the phase of another signal.

33. The apparatus of claim 32, wherein the another signal comprises a clock signal that is recovered from a received signal.

34. The apparatus of claim 25, wherein the means for providing has a quality factor on the order of 10 or more.

35. The apparatus of claim 25, further comprising means for recovering data from ultra-wideband pulses based on the output signal.

36. The apparatus of claim 35, wherein the ultra-wideband pulses are associated with a fractional bandwidth on the order of 20% or more, a bandwidth on the order of 500 MHz or more, or a fractional bandwidth on the order of 20% or more and a bandwidth on the order of 500 MHz or more.

37. A computer-program product for providing an output signal, comprising:
a non-transitory computer-readable medium comprising codes executable by at least one computer to:
provide an oscillating signal;
compare the oscillating signal with an adjustable threshold to provide an output signal; and
generate the adjustable threshold to skew a phase of the output signal to track a phase of another signal.

38. A headset, comprising:
an oscillator circuit configured to provide an oscillating signal;
a comparator configured to compare the oscillating signal with an adjustable threshold to provide an output signal;
a threshold circuit configured to generate the adjustable threshold to skew a phase of the output signal to track a phase of another signal; and
a transducer adapted to provide an audio output based on data that is provided through the use of the output signal.

39. A watch, comprising:
an oscillator circuit configured to provide an oscillating signal;
a comparator configured to compare the oscillating signal with an adjustable threshold to provide an output signal;
a threshold circuit configured to generate the adjustable threshold to skew a phase of the output signal to track a phase of another signal; and
a user interface adapted to provide an indication based on data that is provided through the use of the output signal.

40. A sensing device for wireless communication, comprising:
an oscillator circuit configured to provide an oscillating signal;
a comparator configured to compare the oscillating signal with an adjustable threshold to provide an output signal;
a threshold circuit configured to generate the adjustable threshold to skew a phase of the output signal to track a phase of another signal; and
a sensor adapted to provide data to be transmitted through the use of the output signal.

* * * * *